United States Patent
Papadopoulos et al.

(10) Patent No.: US 11,469,082 B1
(45) Date of Patent: Oct. 11, 2022

(54) PLASMA-BASED ELECTRO-OPTICAL SENSING AND METHODS

(71) Applicant: Innoveering, LLC, Ronkonkoma, NY (US)

(72) Inventors: George Papadopoulos, Nesconset, NY (US); Daniel Bivolaru, Hampton, VA (US); Jiaji Lin, Flushing, NY (US)

(73) Assignee: INNOVEERING, LLC, Ronkonkoma, NY (US)

( * ) Notice: Subject to any disclaimer, the term of this patent is extended or adjusted under 35 U.S.C. 154(b) by 684 days.

(21) Appl. No.: 16/436,249

(22) Filed: Jun. 10, 2019

Related U.S. Application Data

(60) Provisional application No. 62/857,413, filed on Jun. 5, 2019, provisional application No. 62/682,407, filed on Jun. 8, 2018.

(51) Int. Cl.
   *H01J 37/32* (2006.01)

(52) U.S. Cl.
   CPC .. *H01J 37/32568* (2013.01); *H01J 37/32926* (2013.01); *H01J 37/32972* (2013.01)

(58) Field of Classification Search
   CPC ........... H01J 37/32568; H01J 37/32926; H01J 37/32972; H01J 37/32917; H01J 2237/245; H01J 2237/24514; H01J 2237/24535; H05H 1/0031–0043; H05H 1/0081; H05H 1/03–04; H05H 1/24
   See application file for complete search history.

(56) References Cited

U.S. PATENT DOCUMENTS

| | | | | |
|---|---|---|---|---|
| 5,316,983 | A * | 5/1994 | Fujimori | G01N 21/718 356/336 |
| 8,869,603 | B2 | 10/2014 | Epstein et al. | |
| 9,714,967 | B1 | 7/2017 | Weickert et al. | |
| 2009/0151871 | A1 * | 6/2009 | Pease | H01J 37/32935 156/345.28 |
| 2010/0032587 | A1 * | 2/2010 | Hosch | H01J 37/32972 250/493.1 |

OTHER PUBLICATIONS

T. Alge & J. Moehring, 1994. "Modem transport engine experience with enviromental ingestion effects" in: AGARD Conference Proceedings AGARD CP. AGARD, pp. 9-1 through 9-9.

(Continued)

*Primary Examiner* — Henry Luong
(74) *Attorney, Agent, or Firm* — Carter, DeLuca & Farrell LLP; George Likourezos

(57) ABSTRACT

This disclosure relates to systems and methods element identification and quantification. The method includes generating pulsed plasma based on an input voltage and a current so that the pulsed plasma interacts with a particle and atomizes the particle when the pulsed plasma is disposed in a flow field, identifying an atomic emission of the pulsed plasma with an optical sensor, determining element identification and quantification based on the identified emission of pulsed plasma, generating DC plasma having an electrical field based on an input DC voltage and a DC current, positioning the DC plasma in a flow field, detecting a change in the electrical field of the DC plasma, and determining a size of the particle based on the change in electrical field.

19 Claims, 18 Drawing Sheets

(56) References Cited

OTHER PUBLICATIONS

W. Chen & L. Zhao, 2015. "Review—Volcanic ash and its influence on aircraft engine components." Procedia Engineering, vol. 99, pp. 795-803.
V. Chernyak, V. Naumov & V. Yukhimenko, 2004. "Spectroscopy of atmospheric pressure air jet plasma in transverse arc discharge." Nice, France, Oct. 25-29, 12th International Congress on Plasma Physics.
J. Dean, C. Taltavull & T. Clyne, 2016. "Influence of the composition and viscosity of volcanic ashes on their adhesion within gas turbine aeroengines." Acta Materialia, vol. 109, pp. 8-16.
P. Diwakar, P. Kulkari & M. Birch, 2012. "New Approach for Near-Real-Time Measurement of Elemental Composition of Aerosol Using Laser-induced Breakdown Spectroscopy." Aerosol Science and Technology, 46(3), pp. 316-332.
A. Hamed, W. Tabakoff & R. Wenglarz, 2006. "Erosion and Deposition in Turbomachinery." J. Propulsion and Power, 22(2), pp. 350-360.
J. Lekki, et al., 2013. "Multi-Partner Experiment to Test Volcanic-Ash Ingestion by a Jet Engine." [Online] Available at: http://ntrs.nasa.gov/archive/nasacasi.ntrs.nasa.gov/20130013612.pdf.
W. Eaton & J. Smith, 1997. "Micromachined pressure sensors: Review and recent developments," Proc. SPIE—The International Society for Optical Engineering, vol. 3046, pp. 30-41.
G. Blasquez, P. Pons & A. Boukabache, 1989. "Capabilities and limits of silicon pressure sensors," Sensors and Actuators, vol. 17, pp. 387-403.
L. Löfdahl & MW. Gad-el-Hak, 1999. "MEMS-based pressure and shear stress sensors for turbulent flows," Measurement Science and Technology, vol. 10, pp. 665-686.
R. Okojie, A. Ned, A. Kurtz & W. Carr, 1996. "a(6H)-Sic pressure sensors for high temperature applications," in Proc. 1996 IEEE/ASME MEMS Workshop, pp. 146-149.
E. Obermeier, 1995. "High temperature microsensors based on polycrystalline diamond thin films," in The 8th International Conference on Solid State Sensors and Actuators (Transducers '95), vol. 2, pp. 178-181.
F. Guo, T. Fink, M. Han, L. Koester, J. Turner & J. Huang, 2012. "High-sensitivity, high-frequency extrinsic Fabry-Perot interferometric fiber-tip sensor based on a thin silver diaphragm," Optics Letters, vol. 37, No. 9, pp. 1505-1507.
I. Adamovich. et al., 2017. "The 2017 Plasma Roadmap: Low Temperature Plasma Science and Technology," Journal of Physics D: Applied Physics, vol. 50, (323001), pp. 1-46.
H. Conrads & M. Schmidt, 2000. "Plasma Generation and Plasma Sources," Plasma Sources Science and Technology, vol. 9, pp. 441-454.
A. Hurst, T. Olsen, S. Goodman, J. VanDeWeert & T. Shang, 2014. "An Experimental Frequency Response Characterization of MEMS Piezoresistive Pressure Transducers," in Proceedings of ASME Turbo Expo 2014, Düsseldorf, Germany, pp. 1-15.

\* cited by examiner

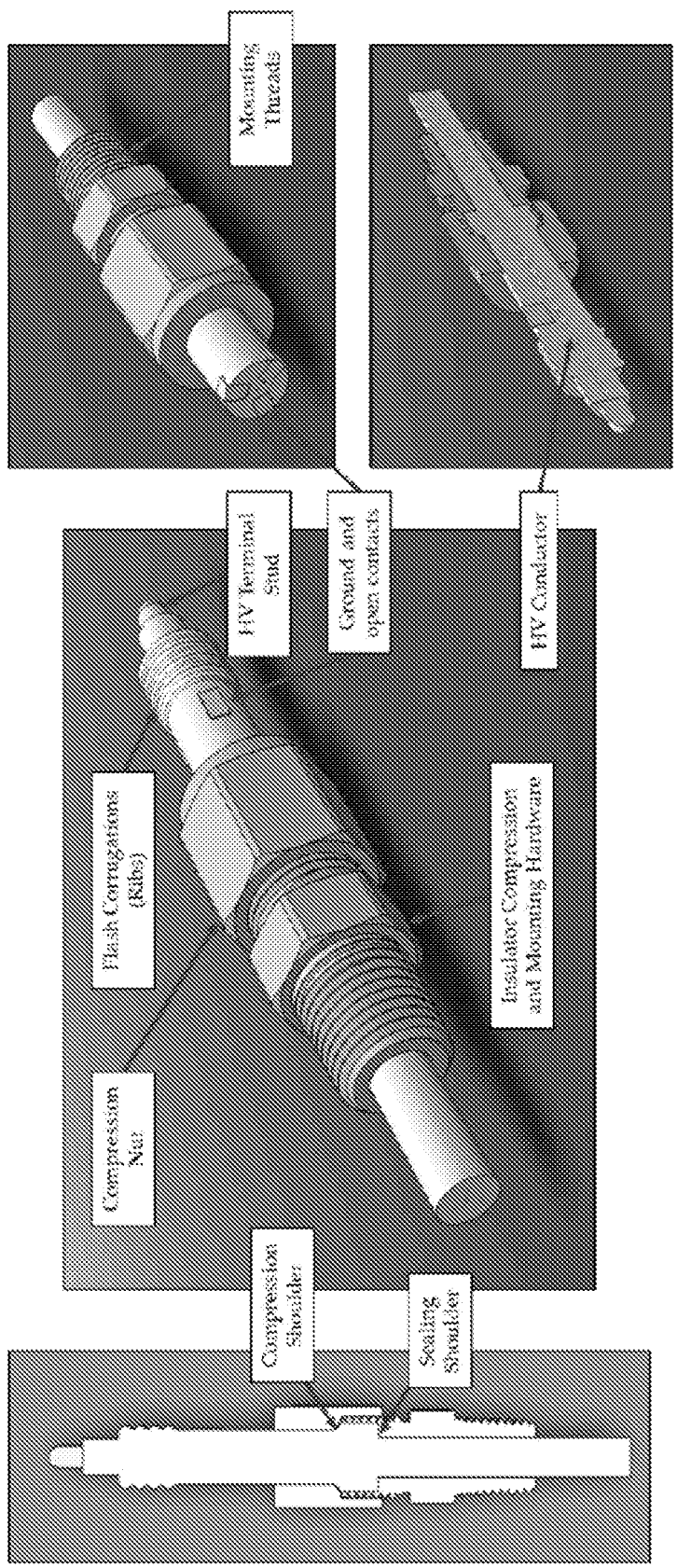

PLASMA-BASED ELECTRO-OPTICAL SENSING AND METHODS

CROSS-REFERENCE TO RELATED APPLICATIONS

This application claims the benefit of U.S. Provisional Patent Application No. 62/682,407, filed on Jun. 8, 2018, entitled "PLASMA BASED ELECTRO-OPTICAL SENSING AND METHODS," and U.S. Provisional Patent Application No. 62/857,413, filed Jun. 5, 2019, entitled "PLASMA-BASED ELECTRO-OPTICAL SENSING AND METHODS," the entire contents of each of which are incorporated herein by reference.

STATEMENT OF GOVERNMENT SUPPORT

This invention was made with U.S. government support under contract numbers DE-SC0018708, N68335-15-C-0282, and N68335-16-C-0500 awarded by SBIR/STTR. The U.S. government has certain rights in the invention.

BACKGROUND

The current state of the art in pressure sensing for dynamic flow measurement is limited and in many cases not available when it comes to harsh, high temperature environments. Accurate pressure measurements of highly transient flows, e.g. combustor instabilities and other dynamic events, requires the sensing element to have the shortest fluidic path connection with the environment and therefore be located in the wall in direct contact with the hot fluid. Active cooling is used to address the high temperature to an extent, with a certain class of sensors capable of operating at temperature of up to 2000 F in this fashion. Beyond this temperature threshold, no practical solution exists for monitoring and/or measuring fluid flow pressure oscillations without a compromise on frequency response.

Experimental studies of turbine engine sand, dust, and ash ingestion have shown that certain constituents, typically those containing Calcium, Magnesium, Aluminum, and Silicon (CMAS) compound minerals and/or Chlorides and Sulfates, are particularly detrimental to engine turbine components. These reactive media undergo a phase change from solid to semi-solid as they pass through the combustion section of the engine under certain conditions characterized by size and mass. The phase change allows them to adhere to various turbine components including but not limited to stator vanes, rotor blades and shrouds.

SUMMARY

With an increasing number of applications in the power, energy generation and advanced propulsion market segments pushing the temperature envelope by leveraging advanced manufacturing and high temperature materials, a growing need exists that can only be addressed by an ultra-high temperature capable pressure sensor with high frequency response.

This disclosure relates to systems and methods for detecting a change in pressure and wall shear flow and, more particularly, to a plasma probe for detecting a change in pressure and wall shear flow.

This disclosure relates to plasma probes for detecting a change in pressure and wall shear flow. In accordance with aspects of this disclosure, a plasma sensor is presented. The plasma sensor includes a first electrode configured to generate DC plasma with an electrical field as a virtual sensor based on an input DC voltage and a DC current, and a probe positioned relative to the first electrode to detect a change in the electrical field.

In an aspect of the present disclosure, the first electrode and the probe may be encapsulated in a cap, the cap configured to confine the DC plasma.

In another aspect of the present disclosure, the cap may include at least one screen, at least one hole, at least one slit, or combinations thereof.

In an aspect of the present disclosure, the cap may define a cylindrical cavity, the cylindrical cavity having a proximal end and a distal end, the proximal end configured to receive the first electrode and the probe.

In yet another aspect of the present disclosure, the proximal end may include a chamfered interior portion.

In a further aspect of the present disclosure, the proximal end may include an interior portion having an elliptically shaped-fill.

In an aspect of the present disclosure, the probe may include at least one Langmuir probe, at least one second electrode, or combinations thereof.

In accordance with aspects of this disclosure a plasma-based sensing system is presented. The plasma-based sensing system includes a plasma sensor, a power control unit configured to supply the input DC voltage and the DC current to the first electrode, a current limiting resistor electrically coupled in series with the power control unit, and a processor in electrical communication with the probe and configured to identify a change in at least one of wall shear flow or pressure based on the change in the electrical field. The plasma sensor includes a first electrode configured to generate DC plasma having an electrical field based on an input DC voltage and a DC current, the first electrode configured to position the DC plasma in a flow field, and a probe configured to detect a change in the electrical field when the DC plasma is positioned in the flow field.

In an aspect of the present disclosure, the system may include a user interface configured to enable user control of DC plasma properties.

In a further aspect of the present disclosure, the system may include a display to display the identified change in pressure.

In yet a further aspect of the present disclosure, the processor may be further configured to determine a fluid dynamic based on the input DC voltage and the DC current.

In yet another aspect of the present disclosure, the processor may be further configured to: determine a plasma property including sheath potential ($\varphi pl(0)$), electron number density ($ne$), floating potential ($\varphi f(0)$), or combinations thereof; and determine a change in a local pressure dynamic field based on the plasma property.

In a further aspect of the present disclosure, the processor may be further configured to determine pressure based on the input DC voltage and the DC current of the first electrode.

In yet a further aspect of the present disclosure, the first electrode and the probe may be encapsulated in a cap, the cap configured to confine the DC plasma.

In yet another aspect of the present disclosure, the cap may include ceramic.

In a further aspect of the present disclosure, the plasma sensor further includes a conductive, porous cap disposed over the first electrode and the probe, the cap configured to confine the DC plasma.

In an aspect of the present disclosure, the probe may include a Langmuir probe.

In another aspect of the present disclosure, the probe may include a second electrode.

In accordance with aspects of this disclosure a method for detecting a change in pressure and wall shear flow is presented. The method includes generating DC plasma having an electrical field based on an input DC voltage and a DC current, positioning the DC plasma in a flow field, detecting a change in the electrical field of the DC plasma, and identifying a change in at least one of wall shear flow or pressure based on the change in the electrical field.

In an aspect of the present disclosure, the method may further include determining a plasma property including sheath potential ($\varphi pl(0)$, electron number density (ne), floating potential ($\varphi f(0)$), or combinations thereof, and determining a change in a local pressure dynamic field.

In accordance with aspects of this disclosure a plasma sensor is presented. The plasma sensor includes a first electrode configured to generate pulsed plasma based on an input voltage and a current so that the pulsed plasma interacts with a particle and atomizes the particle when the pulsed plasma is disposed in a flow field and an optical probe configured for element identification and quantification of the atomized particle.

In yet another aspect of this disclosure, the processor may be further configured to determine particle composition based on the identified atomic emission.

In a further aspect of the present disclosure, the system may further include a second electrode configured to generate DC plasma having an electrical field based on an input DC voltage and a DC current, the second electrode configured to dispose the DC plasma in a flow field, a second probe configured to detect a change in the electrical field, and a second power control unit configured to supply the input DC voltage and the DC current to the second electrode. The processor is in electrical communication with the second probe and configured to identify particle size based on the change in the electrical field.

In a further aspect of this disclosure, the first electrode is further configured to generate DC plasma having an electrical field based on an input DC voltage and a DC current, the first electrode configured to dispose the DC plasma in a flow field. The system further includes a second probe configured to detect a change in the electrical field and a second power control unit configured to supply the input DC voltage and the DC current to the first electrode. The processor is in electrical communication with the second probe and configured to identify particle size based on the change in the electrical field.

In yet a further aspect of the present disclosure, the system may further include a user interface configured to enable user control of DC plasma properties.

In yet another aspect of the present disclosure, the system may further include a user interface configured to enable user control of pulsed plasma properties.

In a further aspect of the present disclosure, the system may further include a display to display the identified particle size.

In yet a further aspect of the present disclosure, the processor may be further configured to: determine a plasma property including sheath potential ($\varphi pl(0)$, electron number density (ne), floating potential ($\varphi f(0)$), or combinations thereof, and determine a change in a local pressure dynamic field based on the plasma property.

In a further aspect of the present disclosure, the probe may include a Langmuir probe.

In accordance with aspects of this disclosure a method for element identification and quantification is presented. The method includes generating pulsed plasma based on an input voltage and a current so that the pulsed plasma interacts with a particle and atomizes the particle when the pulsed plasma is disposed in a flow field, identifying an atomic emission of the pulsed plasma with an optical sensor, determining element identification and quantification based on the identified emission of the atomized particle, generating DC plasma having an electrical field based on an input DC voltage and a DC current, positioning the DC plasma in a flow field, detecting a change in the electrical field of the DC plasma, and determining a size of the particle based on the change in electrical field.

In an aspect of this disclosure, the method may further include determining particle composition based on the identified atomic emission.

In another aspect of this disclosure, the method may further include determining a fluid dynamic based on the input DC voltage and the DC current.

In an aspect of this disclosure, the method may further include displaying on a display at least one of the identified particle size or composition.

The details of one or more aspects of this disclosure are set forth in the accompanying drawings and the description below. Other aspects, features, and advantages will be apparent from the description, the drawings, and the claims that follow.

BRIEF DESCRIPTION OF THE DRAWINGS

A better understanding of the features and advantages of the disclosed technology will be obtained by reference to the following detailed description that sets forth illustrative embodiments, in which the principles of the technology are utilized, and the accompanying drawings of which:

FIGS. 9A-9D illustrate an embodiment of a micro-plasma probe;

Figure 1:
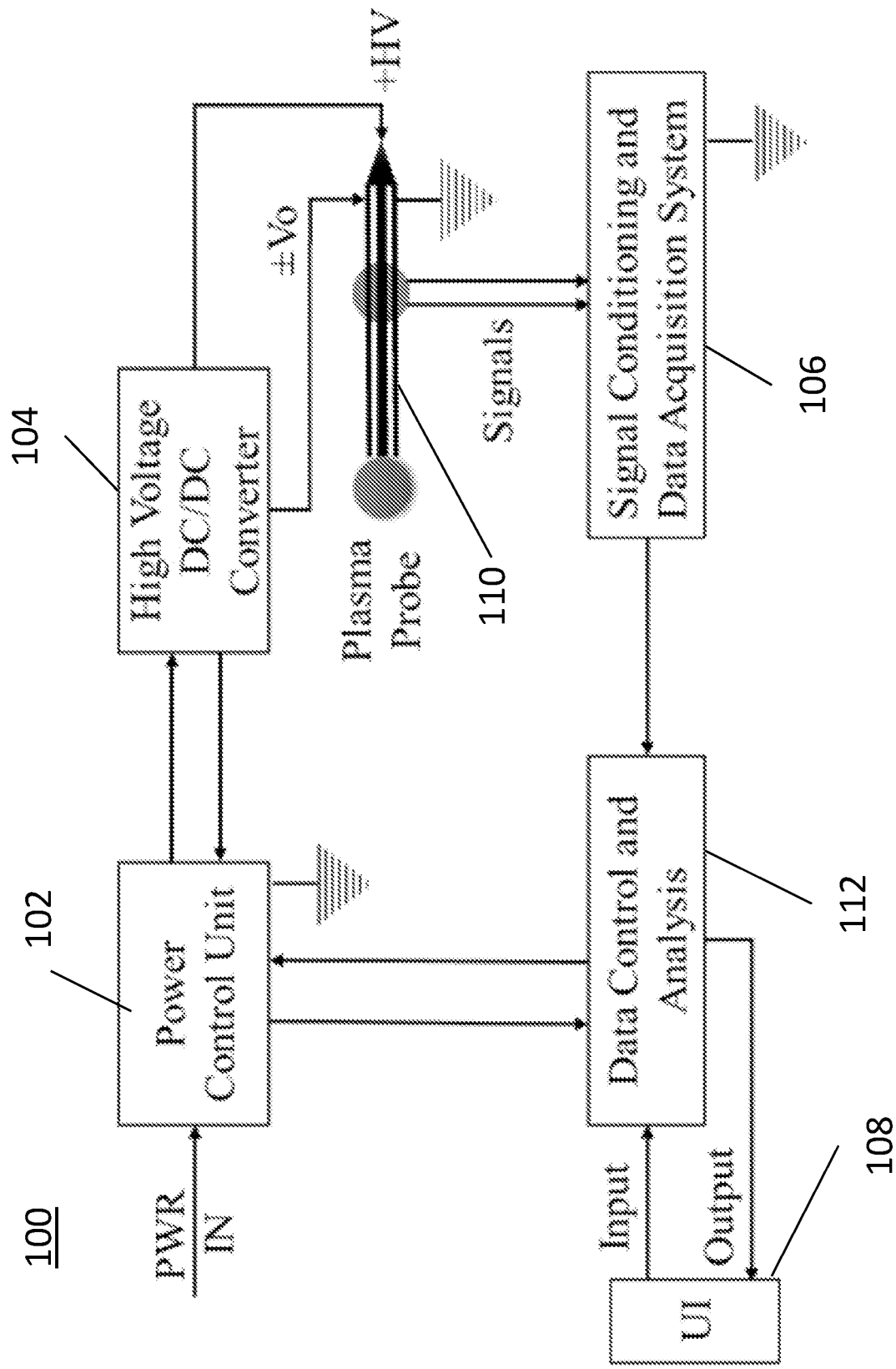
FIG. 1 is a block diagram of one embodiment of a plasma-based system.

Further details and aspects of exemplary embodiments of the disclosure are described in more detail below with reference to the appended figures. Any of the above aspects and embodiments of this disclosure may be combined without departing from the scope of the disclosure.

DETAILED DESCRIPTION

This disclosure relates to plasma-based systems and methods for detecting a change in pressure and wall shear flow, as well as particle size and composition.

Although this disclosure will be described in terms of specific embodiments, it will be readily apparent to those skilled in this art that various modifications, rearrangements, and substitutions may be made without departing from the spirit of this disclosure.

For purposes of promoting an understanding of the principles of this disclosure, reference will now be made to exemplary embodiments illustrated in the drawings, and specific language will be used to describe the same. It will nevertheless be understood that no limitation of the scope of this disclosure is thereby intended. Any alterations and further modifications of the inventive features illustrated herein, and any additional applications of the principles of this disclosure, as illustrated herein, which would occur to one skilled in the relevant art and having possession of this disclosure, are to be considered within the scope of this disclosure.

Continuous glow plasma sensing technology associated with low temperature plasma addresses ultra-high temperature survivability and ultra-high frequency response (>MHz). Experiments show that low temperature plasma (LTP) generation is a viable path to develop a new generation of pressure sensors that can operate in ultra-high temperature environments (>2500 F). Commercial applications span from tracking instabilities in combustions systems for power generation to health monitoring of military/commercial propulsion systems.

FIG. 1 shows a diagram of a plasma-based system 100 for determining changes in pressure or shear in accordance with an embodiment of the disclosure. The term "shear" includes wall shear flow, and adjacent flow direction and speed. The system 100 generally includes a power control unit 102, a high voltage DC/DC converter 104, a plasma probe 110, a signal conditioning and acquisition unit 106, a data control and analysis unit 112, and a user interface 108. The power control unit 102 receives either DC or AC voltage as an input and outputs a DC voltage, which the power control unit 102 sends to the high voltage DC/DC converter 104. The power control unit 102 may monitor the voltage and current for the system 100. The high voltage DC/DC converter 104 converts the DC voltage to a high DC voltage (e.g., 15 kV) at a low current (e.g., 10 mA). The high DC voltage is in electrical communication with the plasma probe 110 for plasma generation. The plasma probe 110 is disposed in a flow field (e.g., air). The plasma probe 110 measures the plasma and detects changes to the electrical field of the plasma. The data control and analysis unit 112 is connected to the plasma probe 110 and identifies changes in the properties of the plasma, for example sheath potential ($\varphi pl(0)$), electron number density ($n_e$), floating potential ($\varphi f(0)$), or combinations thereof. The data control and analysis unit 112 may include a processor and memory. The user interface 108 includes a display and is used to control and monitor the plasma probe 110 response via the data control and analysis unit 112.

In various embodiments, the system 100 provides at least two functions: (1) micro-plasma generation and/or (2) detection of changes in plasma properties due to pressure/shear variations.

In various embodiments, constant glow micro-plasma may be generated by electrical discharges as a transduction method incorporated in a small diameter (e.g., ¼-inch or less) electrically shielded probe that can be installed flush with a wetted surface to detect dynamic pressure fluctuations in harsh environments. The transduction method favors miniaturization without loss of sensing performance, and through appropriate tailoring of power and sensing electronics, frequency responses in excess of 1 MHz are attainable for time-resolving flow interactions and dynamic instability events. Furthermore, the solid state construction and virtual sensor element (mass-less) configuration address reliability and performance requirements under the extreme environmental conditions in which the system needs to operate.

For a range of voltages and currents applied between two closely spaced electrodes, a weakly ionized plasma discharge can be generated that is characterized by a plasma sheath, an electrical layer (typically of the order of 10's to 100's of microns), where the space charge effects dominate. Changes in pressure influence the plasma morphology (shape and thickness of the plasma sheath) and therefore affect the plasma impedance. The change in plasma morphology in turn translates to a change in one of the following plasma properties: sheath potential ($\varphi pl(0)$), electron number density ($n_e$), and floating potential ($\varphi f(0)$). By measuring one or more of these plasma properties simultaneously, it is then possible to discern changes in the local pressure dynamic field.

Plasma properties ($n_e$, $\varphi pl$, $\varphi f$) are not a strong function of the sensor's surface area, therefore making the transducer active area small is not detrimental to sensitivity. Miniaturization then becomes a pragmatic exercise, given the materials available and the fabrication/assembly process that can be leveraged. A cast method, whereby electrodes are placed in a mold that is filled with a ceramic, is a viable approach for large scale production that is straight forward and low cost. A conductive porous cap to access the flow field is integrated at the tip to confine the plasma region, to shield the emitted electro-magnetic radiation and to increase reliability for long duration use.

In various embodiments, MEMS microfabrication techniques may be used on integrated electro-mechanical devices that can be batch fabricated with typical length scales in the micron range. Such a process flow will address the creation of the monolayers of material required for the cathode and anode (metal deposition of platinum, tungsten, or other), while ensuring adequate dielectric material for insulating the cathode and the anode. In various embodiments, the electrical connections may require a third MEMS layer that will allow for backside electrical connections/ feedthroughs to the power source. This laminated arrangement is ideal for MEMS microfabrication, which can deliver accurate electro-mechanical structures with micron level resolution, hence enabling the formation of an array of "plasma pixels."

In various embodiments, typical printed circuit board (PCB) design and fabrication approaches can also be leveraged to achieve similar functionality. Standard PCB fabrication methods can deliver on features that can be as small as 15 to 30 microns. In various embodiments, flexible substrates may be used for sensor panels that can be conformal to non-planar surfaces.

Figure 2B:
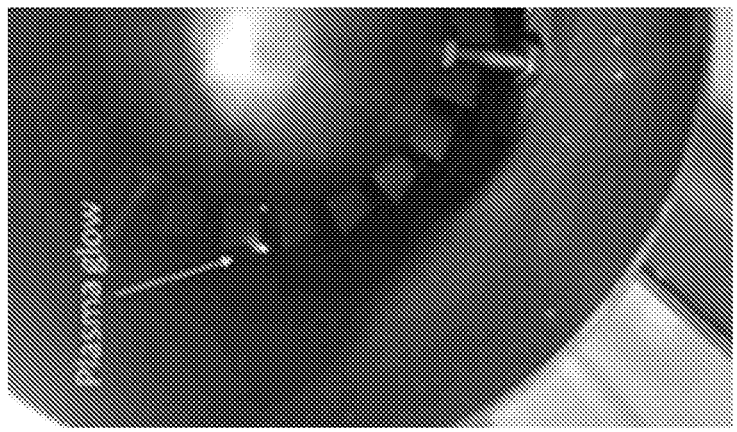
FIGS. 2A and 2B are photographs illustrating a plasma glow probe of the plasma-based system of FIG. 1 disposed in a small gas turbine engine.
Figure 2A:
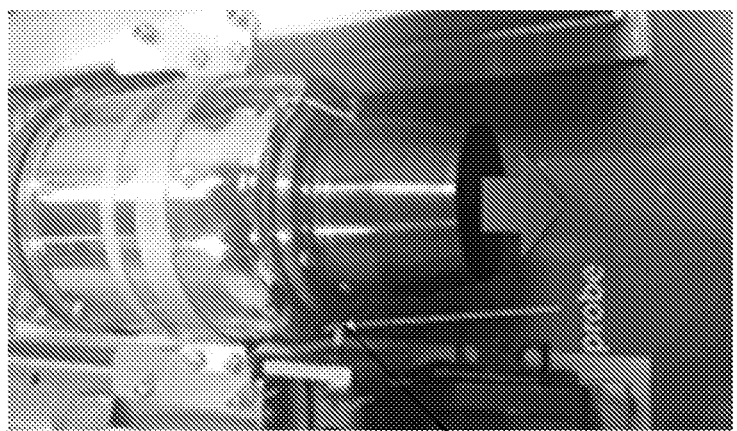

The material nature of the electrodes has little effect on the characteristics of the discharge with the commonly used material for high temperature applications being tungsten. For a constant voltage power source used to power the device, the voltage source E is connected in series with a current-limiting resistor R, so that the voltage between the anode and cathode is $V=E-IR$. The current-limiting resistance is selected such to achieve a stable point of operation between points F and H. Power efficiency can be achieved by trimming the current to a point such to operate in the plasma glow region (region E-H of FIG. 3). Measurements using a probe with a 250 µm electrode gap between the plasma electrodes done at various pressures, from sub-atmospheric (0.1 atm) to above atmospheric (10.5 atm), are shown in FIGS. 2A and 2B. In various embodiments, plasma sensing in pressurized environments of up to 30 atm, combined with temperatures of 2500 F, for example, may be used. Over this wide range of pressures, the plasma current needed for operating at the desired mode is kept almost constant, with the power needed ranging from about 2.4 W at the low end to less than about 4 W, on the high end.

With reference to FIGS. 2A and 2B, a plasma glow probe installed in a small gas turbine engine is shown, in accordance with aspects of this disclosure. In various embodiments, a ⅛-inch diameter plasma probe head may be packaged within a ⅜-inch diameter stainless steel body. The stainless steel body was specifically designed to fit an access port on a large scale gas turbine rig used for testing, resulting in a purposely oversized probe. In addition to the plasma generating electrodes, two sensing electrodes were also embedded within the ⅛-inch diameter probe tip. The plasma probe region was exposed to the flow field in this configuration. In various embodiments, a probe tip may be configured to include a porous metallic interface (probe with shielded electrode configuration with access to the flow field through small holes). It is contemplated that other porous metallic interfaces can be manufactured.

Modern military and commercial gas turbine engines are subject to increased durability, performance, and safety issues when operating in austere environments where significant quantities of sand, volcanic ash and dust are present and can be ingested into the engines. This includes aerosol particulates, organic dirt aerosol and water spray salts at low altitudes, and any other similar natural minerology from global littoral spaces. Significant internal accumulations are at times seen in repair processing, occluding both hot-primary and cooler-secondary flow paths.

Studies of turbine engine sand, dust, and ash ingestion have shown that certain constituents, typically those containing CMAS (calcium-magnesium-alumino-silicate) compound minerals and/or Chlorides and Sulfates, are particularly detrimental to engine turbine components. These studies include measurements performed using large aircraft engines, fighter engines, and cruise missile engines as well as measurement programs performed using engine combustors alone. For these measurements, a variety of foreign particle compositions, concentrations, and duration of exposure were investigated. CMAS and other large airborne particles can erode compressors and seals, and different unique mixture chemistries will clog turbine cooling holes with and without sintering thermal reactions. Further, corrosion from salt and volcanic ash sulfates is another problem. If melted-, or salt-fluxed sintered-, dusts accumulate on turbine vanes and blades, it leads to primary-flow blockage and notable rapid power loss events. Protective coatings throughout the engine can become damaged extensively and rapidly from erosion and chemical reactions. Further, one potentially serious form of engine damage that has not been investigated in any significant detail is the damage to the aircraft (and engine) electronics as a result of this exposure.

It has been confirmed experimentally that the compression system of the engine does a very good job of pulverizing foreign particles. As an example, it has been demonstrated that if the average size of the particles entering the engine inlet is on the order of 37-µm, then average particle size at the Environmental Control System (ECS) bleed is on the order of 6-µm. It is the ECS that supplies the cooling air to the engine and aircraft electronics, as well as, to the cockpit.

As noted earlier, the elemental composition of the foreign particles and the concentration are particularly important for determining the exposure time for which the turbine components (specifically deposition on the first vane row of the high-pressure turbine) can become detrimentally damaged. Thus, it is particularly important to know as soon as is possible the elemental composition of the foreign material, as well as, the concentration so that corrective action can be initiated by the flight crew. Hence, there is a need for a flight-weight, low-volume, engine-integrated sensor system that can measure instantaneously and trending over full-engine life, the total mass, inlet loading rate, particle size distribution, compositional melting point, and salt-fractions.

Figure 3:
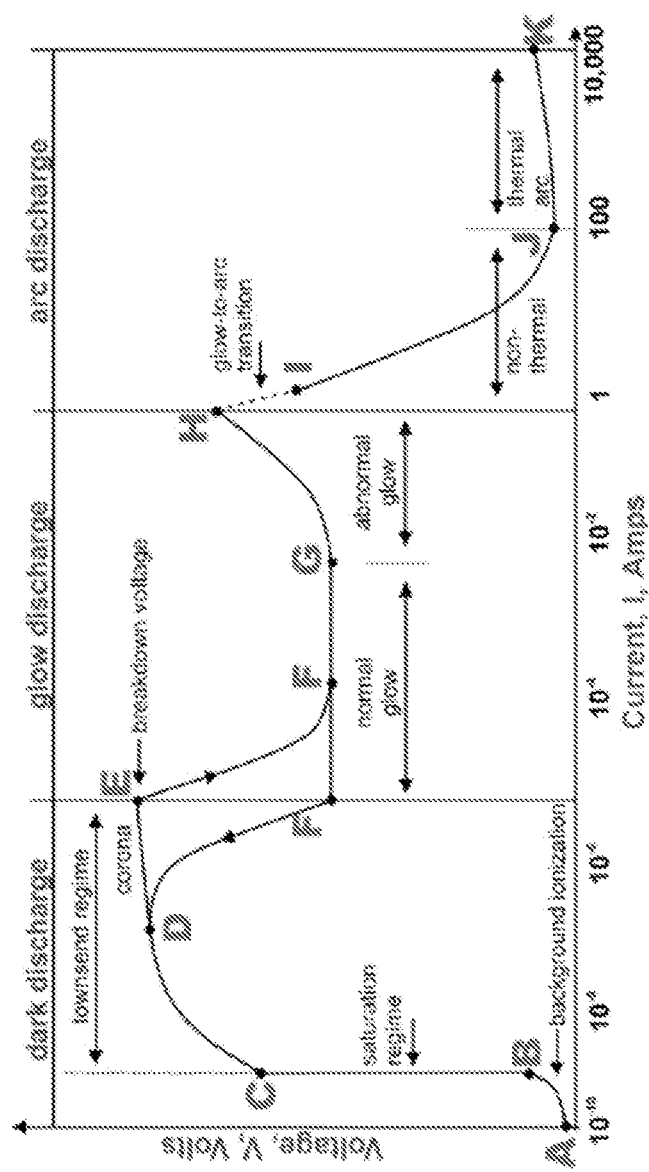
FIG. 3 is an illustration of electric discharge regimes for plasmas as a function of the voltage-current relationship.

With reference to FIG. 3, various types of plasma that are generated include arc discharge, normal or abnormal glow discharge, etc. FIG. 3 shows the voltage-current regimes for the various plasmas.

Plasmas are considered the fourth state of matter, making up 99.99% of the observable matter in the universe. Their applications are very diverse, and plasmas are found and utilized in everything from commercial products (neon lights, fluorescent lamps, TVs) power generation (e.g. fusion reactors), plasma gasification technology (waste-to-energy), plasma thrusters/electric propulsion for spacecraft, electronic switching devices, materials processing for manufacturing integrated circuits/semiconductors and devices in the electronics (e.g. MEMS), chemical, automotive and aerospace industries. There has been considerable interest in utilizing DC micro-plasma discharge devices that enable the generation of plasmas at length scales ranging from 10-100 µm, and at near atmospheric pressure conditions. When voltage is applied between two electrodes situated in close proximity to each other, a weakly ionized, low temperature plasma discharge can be generated. This in turn creates a plasma sheath, an electrically ionized boundary layer (typically of the order of 10's to 100's of microns), where space charge effects dominate. The sheath acts like a virtual capacitor, with the plasma behaving as an inductor.

In various embodiments, plasmas are generated by supplying energy to a neutral gas causing the formation of electrons and ions. The most common method of generation is to apply an electric field by means of a pair of electrodes resulting in electrical breakdown of the neutral gas. Discharges are classified as DC discharges, AC discharges or pulsed discharges on the basis of the temporal behavior of the sustaining electric field. The voltage-current combination determines the type of discharge generated, as illustrated in FIG. 3.

The breakdown voltage marks the point (E) when a visible glow discharge is obtained, which essentially marks the initiation of a chain reaction that leads to avalanche breakdown and a cascade of released electrons. For a range of voltages and currents applied between two closely spaced electrodes, a weakly ionized plasma discharge can be generated that is characterized by a plasma sheath, an electrical layer (typically of the order of 10's to 100's of microns), where the space charge effects dominate (glow discharge).

Figure 4:
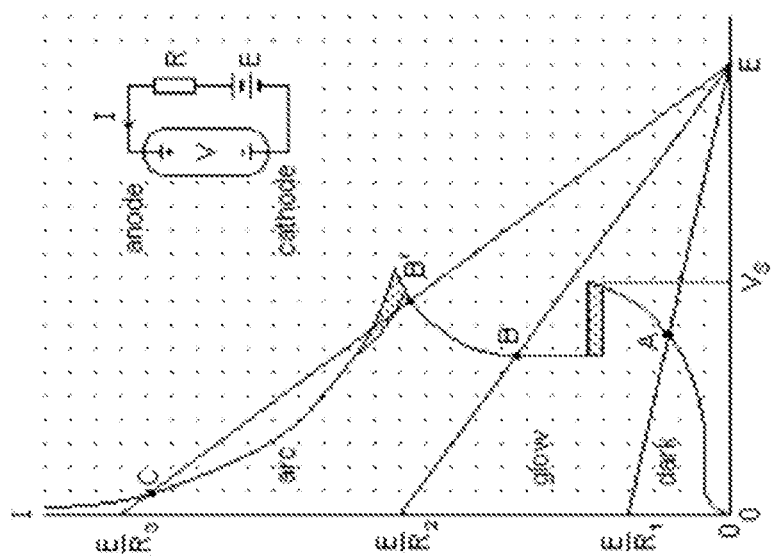
FIG. 4 is an illustration of discharge static V-I characteristic.

With reference to FIG. 4, an illustration of discharge static V-I characteristic is shown, in accordance with aspects of this disclosure. The Paschen curve provides the relationship between breakdown voltage and the product of pressure and electrode separation distance, pd. It is given by the following equation:

$$V_B = \frac{Bpd}{\ln(Apd) - \ln\left[\ln\left(1 + \frac{1}{\gamma_{se}}\right)\right]}$$

where A, B are constants, p is the absolute pressure (Pa), d is the gap distance (m), and $\gamma_{se}$ is the secondary electron emission coefficient. The parameter A is the saturation ionization in the gas at a particular E/p (applied electric field/pressure), and B is related to the excitation and ionization energies. The values of these parameters are determined experimentally and found to be roughly constant over a range of E/p for any given gas.

For a given electrode configuration, the nature of the electrodes has little effect on the characteristics of the discharge. Commonly-used materials are carbon, platinum, iron, nickel or tungsten. The voltage source E is connected in series with a current-limiting resistance R, so that the voltage between anode and cathode is V=E−IR. This relation is expressed by the load lines in FIG. 4, for values of R equal to R1>R2>R3.

With reference to FIG. 4, point A on the curve marks a stable point of operation. If the current I reduces for some reason, then the voltage between the anode and cathode becomes smaller, subsequently acting to increase the current restoring it to the value before the disturbance. The opposite is true when I increases. If the current-limiting resistor is reduced further, then point A moves up the curve until the sparking potential is reached. The operating voltage drops and the next stable operating point is reached, point B. A self-sustained glow discharge exists, but cathode heating is not sufficient to cause transition to an arc. Further reduction in the current-limiting resistance serves to increase the voltage and bring the discharge to point B', which although stable to small fluctuations, can quickly move to point C if cathode heating increases the electron supply to lower the discharge voltage. At point C an arc exists, a condition that is not desirable for the current application. Rather, operating between points B and B' is where a constant glow stability exists, with current levels less than 10 mA, as has been observed in previous experiments.

Generating a plasma is quite straightforward, simply requiring two electrodes (cathode and anode) spaced at some distance apart and electric potential applied across them. The type of plasma that is generated (e.g. corona discharge, arc discharge, abnormal glow discharge, etc.) is a function of the electric potential characteristics, namely voltage (V) and current (I). The nature of the electrodes has little effect on the characteristics of the discharge. Commonly-used materials are carbon, platinum, iron, nickel or tungsten. The power source E is connected in series with a current-limiting resistance R, so that the voltage between anode and cathode is V=E−IR.

Figures 5, 6:
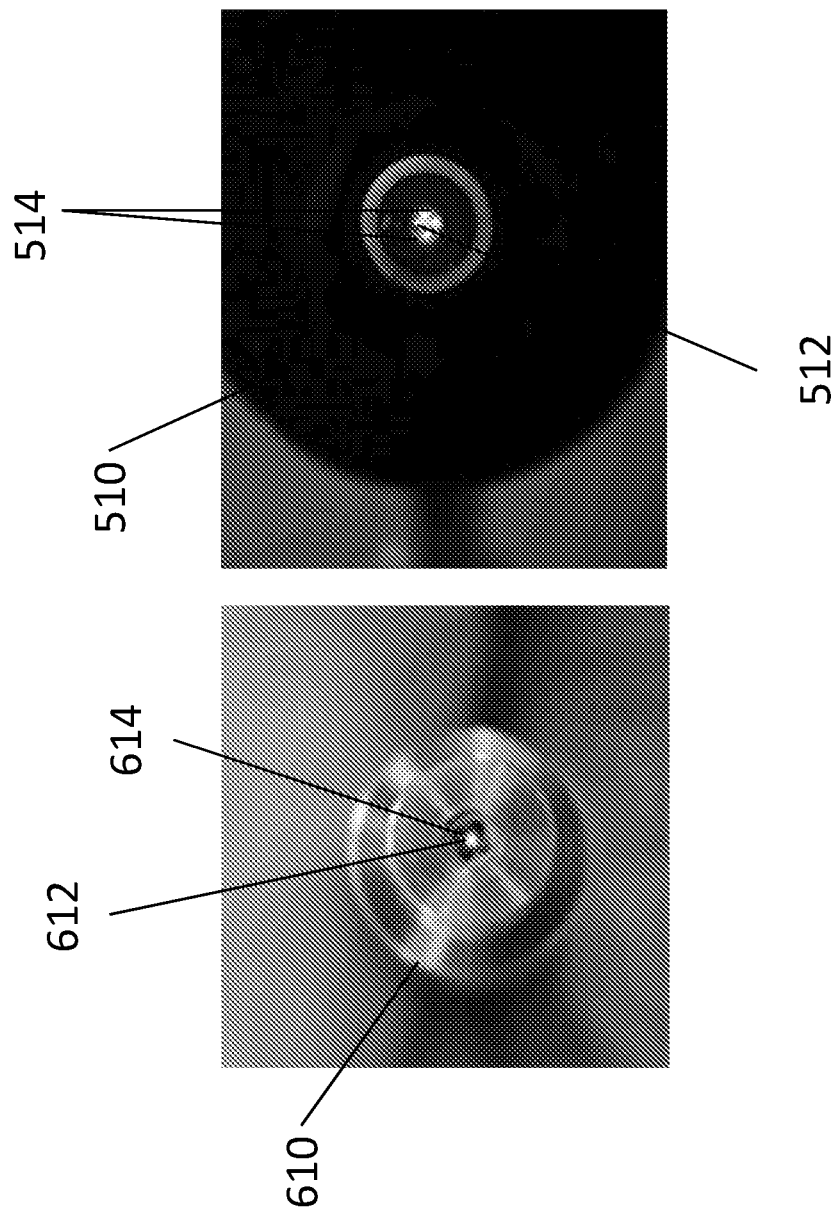
FIG. 5 is a probe configuration showing micro-plasma generation for optical luminosity measurement.
FIG. 6 is a probe configuration showing micro-plasma generation for electrical property sensing.

With reference to FIGS. 5 and 6, probe configurations showing micro-plasma generation and sensing approaches is shown, in accordance with this disclosure. In various embodiments, the probe 610 of FIG. 6 has embedded electrodes 614 for electrical property sensing of the electric field of the plasma discharge 612, while the probe 510 of FIG. 5 shows embedded optical fibers 514 (illuminated red and green) on either side of the plasma discharge 512 (purple vertical line) for optical luminosity measurement.

Figure 7:
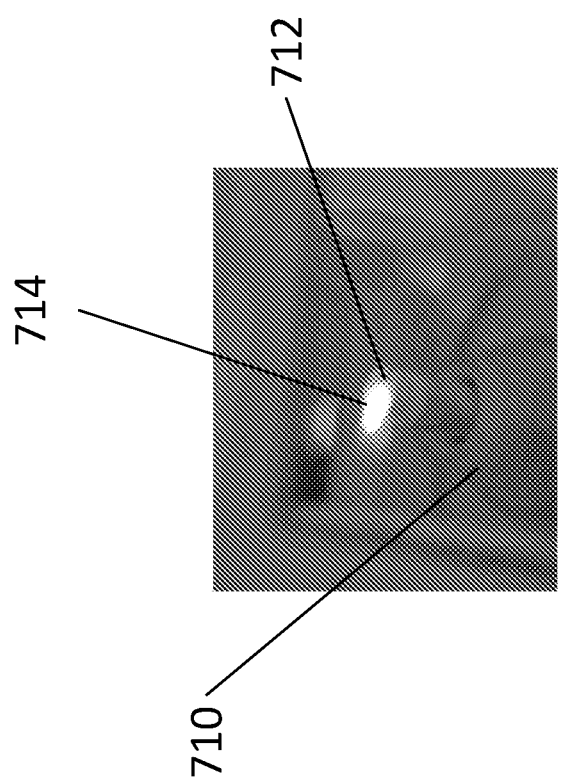
FIG. 7 is an illustration of micro-plasma probe with embedded fibers showing plasma luminous field distortion in a high velocity cross-flow.

With reference to FIG. 7, an illustration of micro-plasma probe 710 with embedded fibers showing plasma luminous field distortion 714 in a high velocity cross-flow is shown. Flow shear across the probe surface 712 results in plasma electrical field distortion in the direction of flow shear. As such, the distortion, both in magnitude and direction, may be sensed electrically or optically by embedding a series of electrodes or optical fibers in line and at several distances from the plasma generation source (i.e. the generating electrodes).

Figure 8:
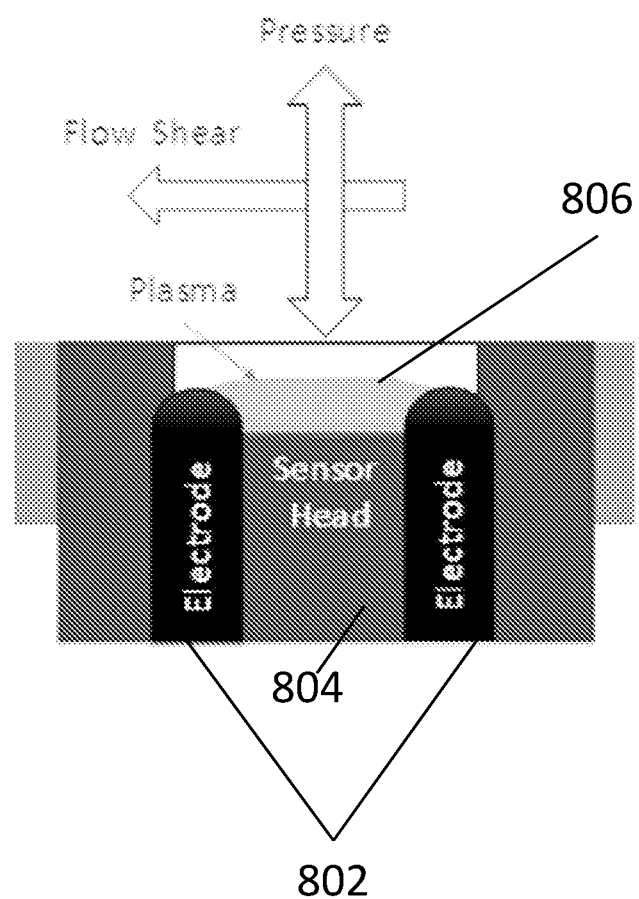
FIG. 8 is an illustration of a head of a micro-plasma probe in accordance with aspects of this disclosure.

With reference to FIG. 8 a head 800 of a micro-plasma probe is shown, in accordance with aspects of this disclosure. The head 800 of the micro plasma probe includes electrodes 802 for generating plasma 806, the electrodes 802 disposed around a sensor head 804. The sensor configured to measure plasma electric field characteristics.

In various embodiments, sensing with micro-plasma involves a probe head 800 that incorporates electrodes 802 for surface micro-plasma generation and at least one other electrode (sensor head 804) situated in close proximity to the plasma region to provide real-time measurements of the plasma electric field characteristics. Changes in pressure influence the plasma morphology (shape and thickness of the plasma sheath) and therefore affect the plasma impedance. The change in plasma morphology in turn translates to a change in one of the following plasma properties: sheath potential ($\varphi pl(0)$), electron number density (ne), and floating potential ($\varphi f(0)$). By measuring one or more of these plasma properties simultaneously, it is then possible to discern changes in the local pressure dynamic field.

In general, plasma properties (electron number density (ne), plasma potential ($\varphi pl$), and plasma floating potential ($\varphi f$)) can be determined several ways, from sophisticated and expensive emissions spectroscopy techniques, to the very simple and inexpensive electrical Langmuir probes. Langmuir probes can be fabricated easily from the same material as the plasma electrodes. They can be small (<0.25 mm in diameter) and they can be made of tungsten wire incased within an Al2O3 tubing. These plasma sensing probes are typically inserted into the plasma sheath region. In the present case, they are embedded within the probe body in a compact geometry and thus an integral part of the sensor active area.

In various embodiments, the Langmuir probes are typically biased by applying a sweeping voltage around the plasma potential. As the probe voltage is biased and swept, a Voltage-Current (V-I) characteristics is obtained. In various embodiments, the Langmuir probe may be biased relative to the ground level through a network of resistors and measure the voltage drop across one of them. This provides a pathway for electrons and/or ions to the ground, which can be moderated by the choice of resistance to achieve an optimum signal level and frequency response. As the electric field generated within the probe region modulates due to the dynamic pressure environment caused by the flow field, the current flow through the Langmuir probe modulates as well. The measurement response is related to the stability of the plasma electric field, which in turn is related to the amount of electrons/ions extracted through the sensing Langmuir probe. Similar data can be obtained by monitoring the plasma current, but the use of a Langmuir probe allows an additional level of detection that can deliver enhanced performance. Both techniques may be used for the probe configuration.

In various embodiments, the sensor involves a probe element that incorporates electrodes for surface micro-plasma generation and at least one other electrode situated in close proximity to the plasma region to provide real-time measurements of the plasma electric field characteristics. The nominal construction involves tungsten wires embedded within an alumina oxide body. If needed, the sensor may be packaged in a stainless steel or Inconel body, or other high temperature material (alloy or ceramic), such to protect the plasma region and provide access to the external environment. In this way the probe head can be flush mounted with the inner wall surface of a test section and provide electromagnetic shielding from the plasma region. The size of the probe head can be made small (millimeters) with an active element that is sub-millimeter, while the length is primarily dictated by the packaging and attachment to the test cell. The interaction of the plasma region with the flow field is through holes or slits, or other porous configuration, arranged in a pattern about the probe head. Probe operation favors a small design, and unlike other sensing techniques that are challenged with miniaturization, the current approach will yield better performance when the probe head is miniaturized to sub-millimeter spatial separation between the probe electrodes. The improved performance comes from the lower power requirements associated with surface plasma generation by electrical discharges (est. to less than 1 W for the plasma head at atmospheric conditions). By maintaining the relative scale of the surface pattern, the sensitivity to flow dynamics is not sacrificed during the miniaturization process, with frequency response tailorable through sensing electrode potential adjustment.

The attraction to the use of plasma discharge as a transduction method for fluid flow pressure and wall shear stem from the fact that it lends itself to a probe implementation that is simple in design, can be miniaturized, and at the same time offers unmatched capability for handling ultra-high temperature environments. The materials of construction are nominally tungsten for the electrodes and alumina oxide for the packaging. Sensing plasma discharge characteristics and their variation due to flow interaction can be done optically or electrically.

FIGS. 9A-9D show an embodiment of a micro-plasma probe in accordance with aspects of this disclosure. In various embodiments, the plasma probe includes a custom ceramic component machined to integrate tungsten wires. This ceramic component is encapsulated using additional ceramic cast around it to result in the concept shown in FIG. 9. The tip of the probe featured plasma generation electrodes having a small spacing, which may be designed to 250 microns, for example. The form of the ceramic substrate featured a compression shoulder so that it naturally seals under differential pressure when implemented in high pressure systems.

The main parts of the probe tip that are exposed to the environment are the plasma electrodes (e.g., tungsten) and high temperature ceramic (e.g., alumina oxide) containing the tungsten sensing electrodes. The tungsten electrodes and alumina oxide are all materials often used in harsh environments. Therefore, they offer exceptional durability, including erosion from impinging solid particles. Both materials have often been used in heavy mechanical machining and in harsh environments such as thermal barrier coatings (TBCs) for turbine blades.

Figure 10A:
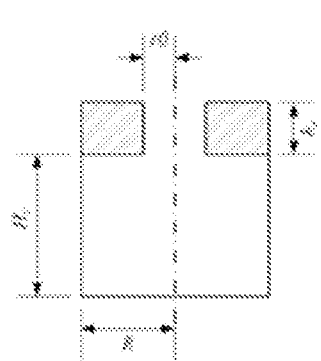
FIGS. 10A and 10B illustrate a cylindrical cavity and screen geometry of a micro-plasma probe.
Figure 10B:
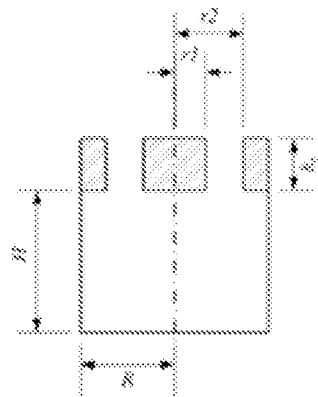
Figure 11A:
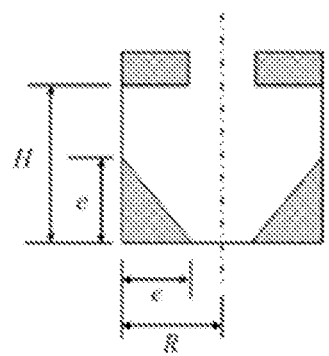
FIGS. 11A and 11B illustrate a cylindrical cavity with chamfer and screen geometry of a micro-plasma probe.
Figure 11B:
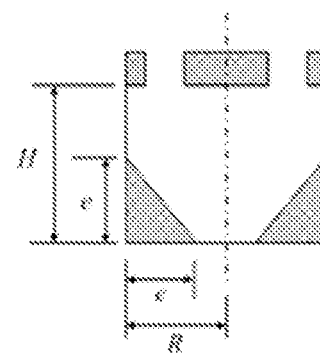
Figure 12A:
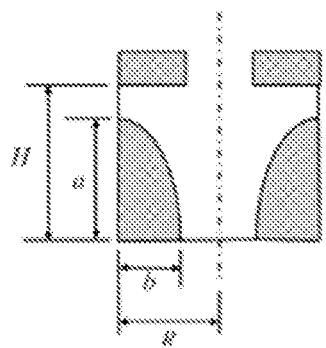
FIGS. 12A and 12B illustrate a cylindrical cavity with elliptically-shaped fill and screen geometry of a micro-plasma.
Figure 12B:
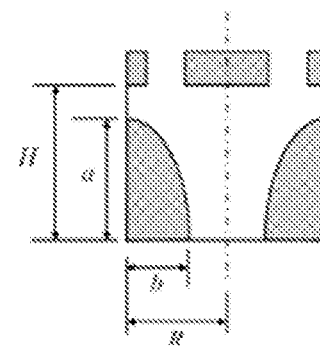

With reference to FIGS. 10A, 10B, 11A, 11B, 12A, and 12B, various embodiments of probe tips are shown in accordance with this disclosure. FIGS. 10A and 10B show two variants of a cylindrical packaging with screens that feature either a center hole, or a series of holes/slit around the perimeter. The sensing element resides near or at the bottom of the cavity portion of the packaging. Variants of the nominal transducer tip design are shown in FIGS. 11A, 11B, 12A, and 12B, considering internal cavity fills that will change the internal volume. A key advantage of the virtual nature of the sensing element associated with the plasma probe is the freedom the lack of mechanical features gives in tailoring the cavity shape to maximize frequency response.

Figure 14:
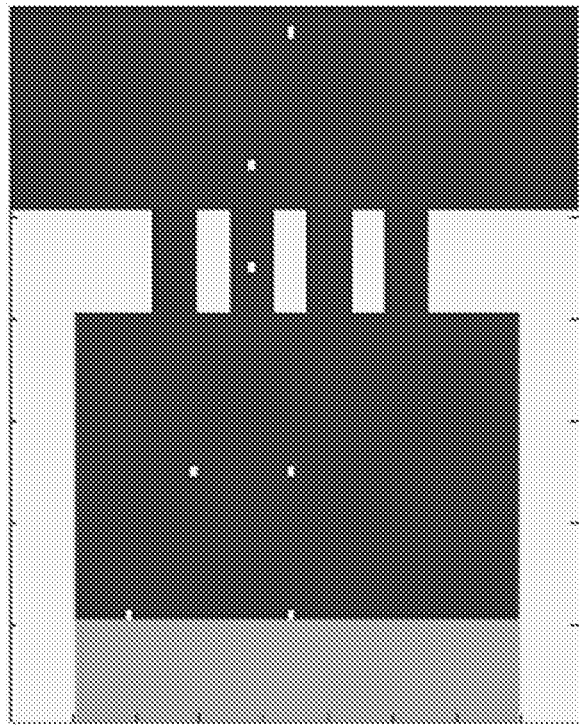
FIG. 14 is an illustration of time domain analysis of the cavity screen geometry of a micro-plasma probe of FIG. 13.
Figure 13:
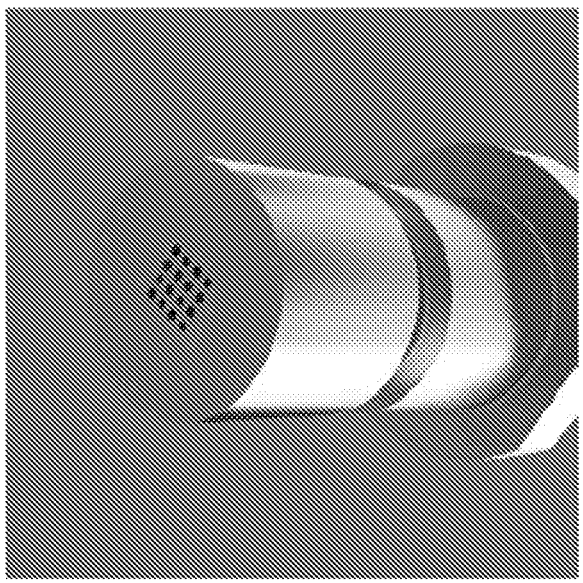
FIG. 13 is an illustration of a cavity screen geometry of a micro-plasma probe.

In various embodiments, time domain analysis may be performed on the configuration shown in FIGS. 13 and 14. Three-dimensional simulations may be performed considering also materials of construction, with the screen and outer packaging being stainless steel (yellow) and the sensing element substrate being ceramic (cyan). The rest of the domain (blue) is assumed air at specified temperature (cavity, intra-hole space, and external domain). The instantaneous pressure at various sampling points within the air domain, shown in FIG. 14 as yellow dots, was stored during the simulations for post-run analysis. A single frequency tone-burst pressure signal having a rectangular envelope was prescribed at the external air domain boundary (right side of domain in FIG. 14).

Figure 15:
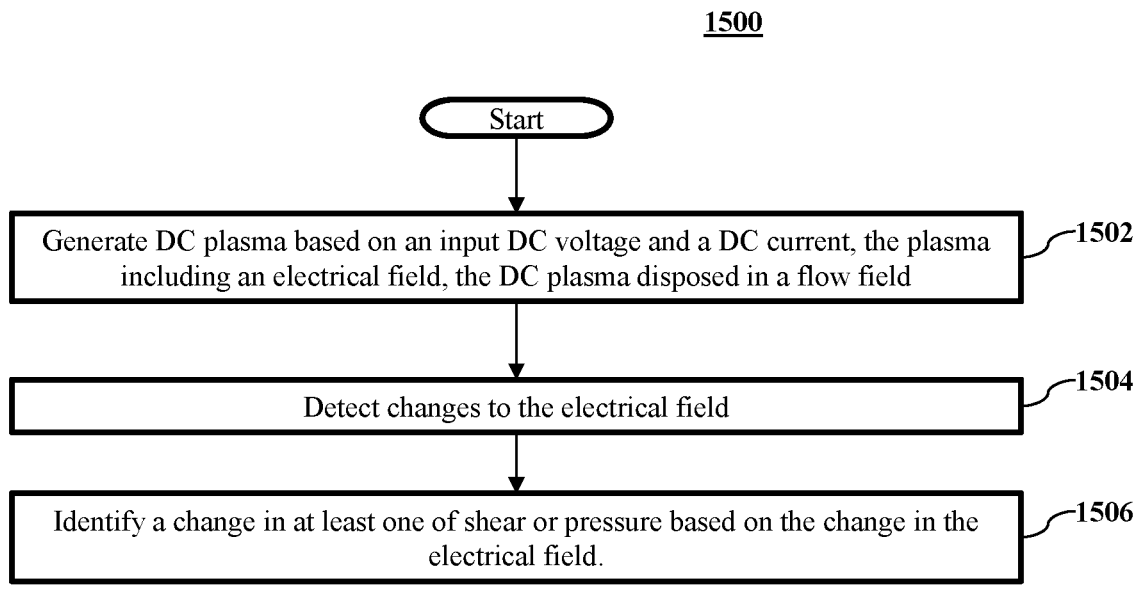
FIG. 15 is a block diagram of a method for detecting a change in pressure and shear.

With reference to FIG. 15, an exemplary block diagram of a method for detecting a change in pressure and shear in accordance with aspects of this disclosure is shown. The following description will refer to the system, but it will be understood that such description is exemplary and does not limit the scope and applicability of this disclosure.

Initially at step 1502, the system generates DC plasma based on an input DC voltage and a DC current, the plasma including an electrical field. The DC plasma is disposed in a flow field. In various embodiments, the system includes a first electrode configured to generate DC plasma, relative to a low potential electrode (ground electrode). In various embodiments, the system may include a power control unit configured to supply the input DC voltage and the DC current to the first electrode. In various embodiments, the DC plasma may be used as a virtual sensor. In various embodiments, the DC plasma is generated based on an input DC voltage and a DC current. In various embodiments, the plasma including an electrical field. In various embodiments, multiple probes can also be positioned relative to the first electrode and with respect to each other to detect spatial evolution of the electrical field.

Next at step 1504, the system detects changes in the electrical field due to particle interaction with the plasma. In various embodiments, a probe may be disposed proximate to the electrical field. In various embodiments, the probe may be configured to detect changes to the electrical field. In various embodiments, the probe includes a Langmuir probe.

Figure 16:
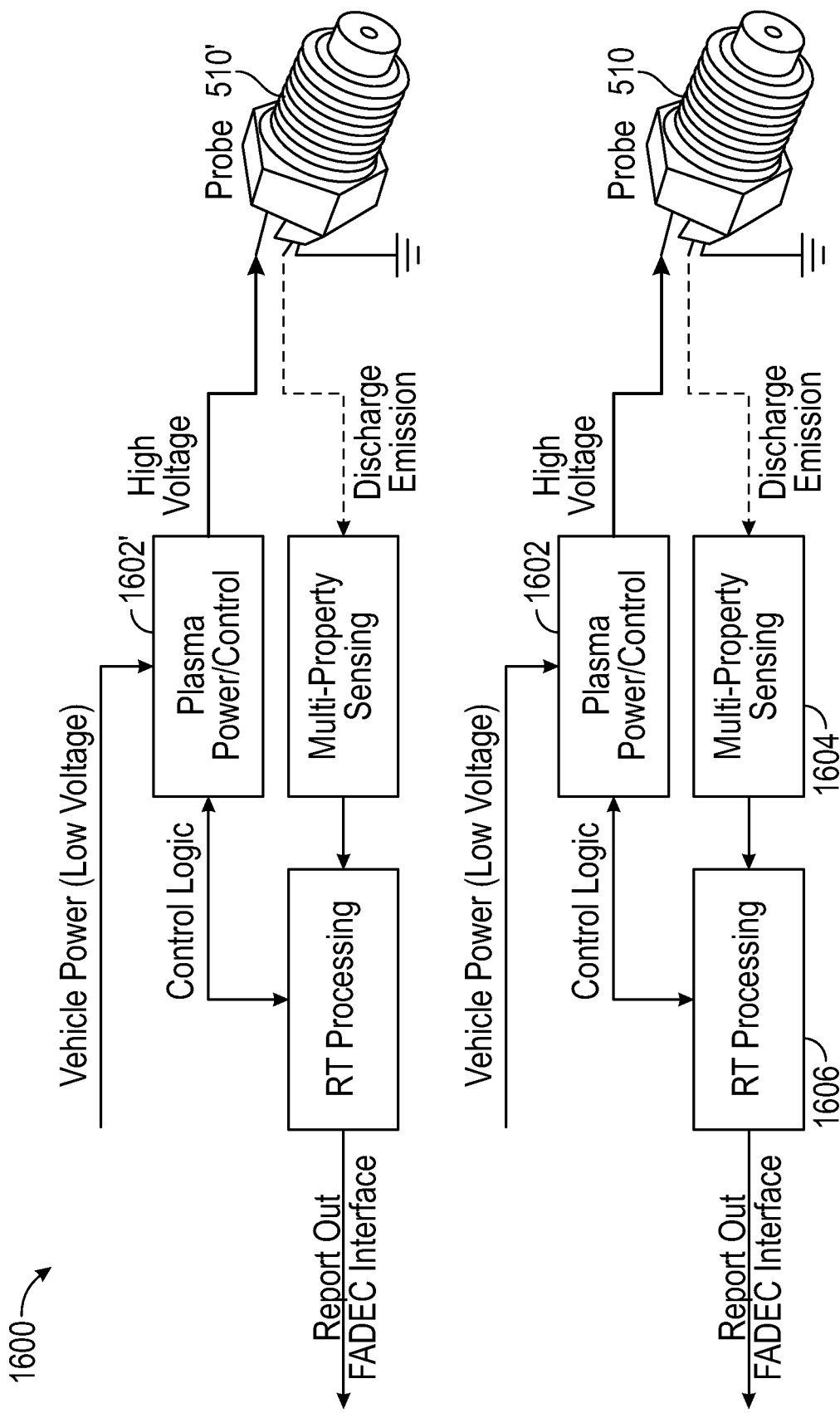
FIG. 16 is a block diagram of a plasma-based system for detecting atomic emissions.

In various embodiments, the probe includes an optical fiber. In various embodiments, the probe includes a second electrode 510' (FIG. 16).

In various embodiments, the first electrode and the probe may be disposed in a ceramic filled mold. In various embodiments, a conductive porous cap may be disposed over the first electrode and the probe, the cap configured to confine the DC plasma designed for plasma generation or plasma properties detection.

Next at step 1506, the system identifies a change in at least one of shear and pressure based on the change in the electrical field. In various embodiments, the system may include a processor configured to identify a change in at least one of shear and pressure based on the change in the electrical field. In various embodiments, a current limiting resistor disposed of electrically in series with the power control unit. In various embodiments, the processor may be configured to determine pressure based on input voltage and current of the first electrode. In various embodiments, the processor may be configured to determine a fluid dynamic based on monitoring the input voltage and current. In various embodiments, the processor may be configured to measure at least one of sheath potential, φpl(t), electron number density, ne, or floating potential φf(t) and determine changes in a local pressure dynamic field based on the measuring.

In various embodiments, a measurement approach that leverages plasma interaction and dissociation with particles to yield the measurements of interest forms the basis for the real time particle ingestion sensor system development, in accordance with this disclosure is shown. A block diagram of the sensor system, in accordance with this disclosure, is shown in FIG. 1 with a single probe attached.

In various embodiments, a larger system comprised of a network of probes may include a multiple of what is shown, all managed by a central processing unit that gathers the processed output from the individual sensors and communicates a consolidated result to the FADEC and/or aircraft mission computer. In various embodiments, discrete probes may be disposed at several places on the engine, such as the inlet, inlet particle separator (IPS), compressor and turbine stages.

Figure 20:
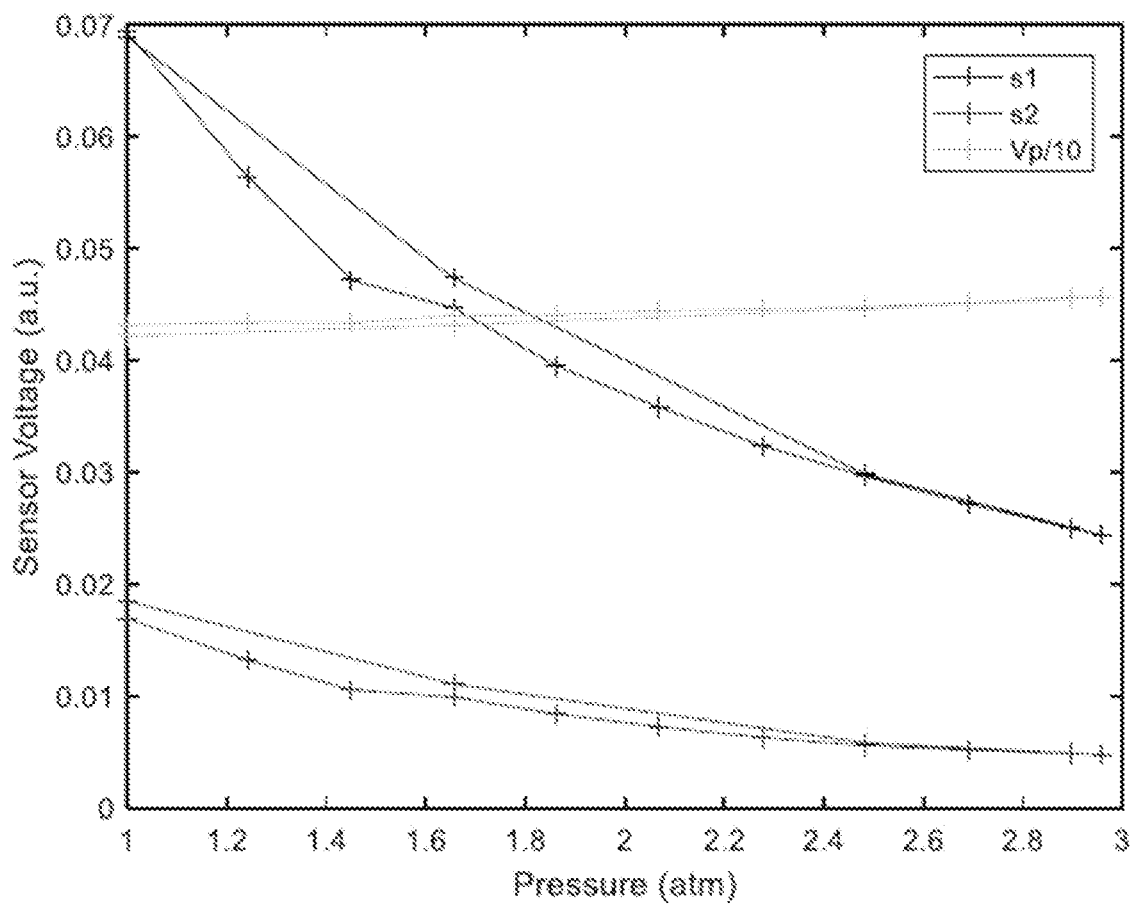
FIG. 20 is an illustration of pressure vs sensor voltage.

With reference to FIG. 20, a graph of pressure vs sensor voltage for two Langmuir probes is shown. FIG. 20 illustrates the raw data obtained with two Langmuir probes embedded in the sensor head. The probes were mounted symmetrically around the plasma region. For simplicity, the probes were connected to the ground potential near the electron retardation region of the I-V characteristic curve of the probe therefore collecting mostly ions and a low number of electrons. As shown in the figure, when the pressure increased the cathode potential (green trace) increased and the current through the probes (blue and red traces) decreased exponentially due to the confinement of the plasma sheath that reduced the amount of ions reaching the Langmuir probes. At low pressure, the current density in the glow discharge can be approximated by the empirical collisional Child law given by the equation, $$j_0 = C_1 f(\lambda_i) \frac{E_0^{2.5}}{s^{2.5}} \qquad (5)$$

where s is the plasma sheath thickness at the cathode, j0, is the electrical discharge current density and E0 is the cathode potential. At high pressures the discharge current density is strongly dependent on diffusion when the ion mobility becomes important. At high pressures the law is expressed as, $$j_0 = C_2 f(\mu_i) \frac{E_0^2}{s^2} \qquad (6)$$

where μi=f(λi, |ui(x)|, M) is the ion mobility which is a function of the ion mean-free-path, the ion velocity ui(x)=μiE(x) and the ion mass M. The electric field E(x) is the electric field in the plasma sheath which is strongly dependent on distance from the source. The quantities C0,1,2 are constants depending on ε0 and M.

In these equations, the pressure dependency arrives from the dependency of the ion mean-free-path function of the gas density, λi=1/(ngσi) where λi is the ion mean-free-pat and ng=p/(kTg) is the gas density at pressure p and temperature Tg. The ion-atom collision cross-section, σi is about 5e-15 cm2 in low pressure argon. Therefore, the function $f$ is inversely proportional to pressure. Assuming that the measured probe current Im is the current density through the plasma sheath and rearranging Eq. (5) we obtain $$f(p) = C_0 \frac{E_0^n}{I_m} \qquad (7)$$

Figure 21:
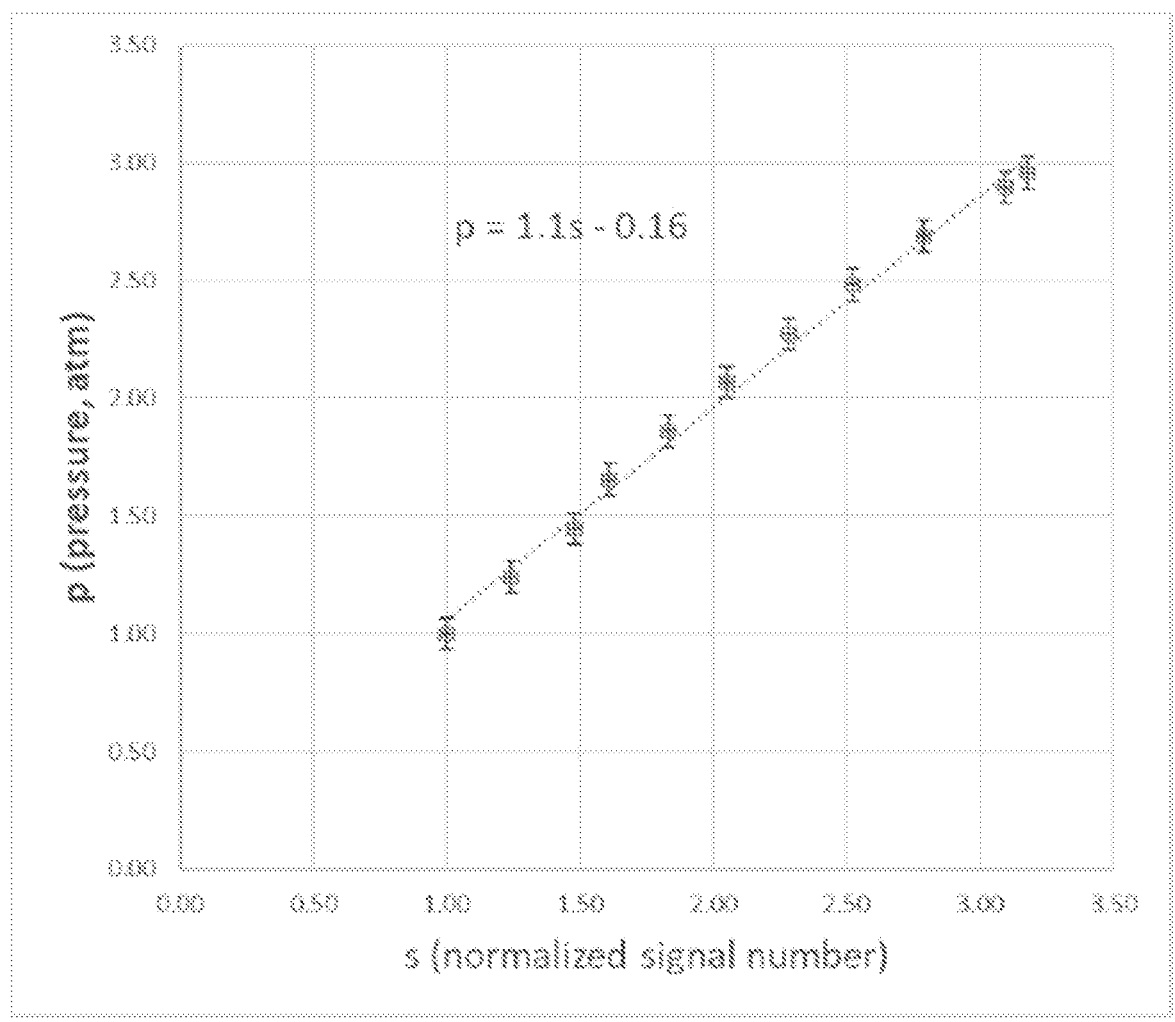
FIG. 21 is an illustration of the dependency of normalized functions.

FIG. 21 shows the dependency of the normalized function s=$f$(p) for E01.5 in the range from 1 to 3 atmospheres. The error on pressure during these experiments is due to the use of an analog gauge to measure the pressure at discrete points. The error on the measured signal derives only from the electrical noise from the probe electronics. From the trend line shown as a dotted line in the figure, the measured pressure characteristic of the probe is with a good approximation a linear function of the s parameter. The calibration equation is p=1.1 s−0.16, where p is the pressure in units of atmosphere and s is the normalized function $f$(p).

With reference to FIG. 16, a diagram of a system 1600 for detecting atomic emissions in accordance with aspects of this disclosure. The system 1600 generally includes a first plasma power and control unit 1602, a probe 510, a sensing unit 1604, and a processing unit 1606. The first plasma power and control unit 1602 converts a vehicles low voltage to a high voltage for the probe 510 to generate plasma. In various embodiments, the probe 510 receives a voltage and generates a pulsed plasma. The probe 510 is generally disposed in a flow field. The probe 510 includes one or more electrodes for generating the plasma and an optical probe for element identification and quantification. Particles interacting with the generated plasma ablate and atomize, resulting in atomic emissions. The optical sensor captures the atomic emissions. The output of the optical sensor is then recorded by the sensing unit 1604, which may include an optical spectrometer. The sensing unit 1604 sends the sensed properties of the atomic emissions to the processing unit 1606 for further processing. The processing unit 1606 includes a memory and a processor. In aspects, the system 1600 may include a second power and control unit 1602' configured to supply the input DC voltage and the DC current to the second electrode 510'.

Particles interacting with the plasma ablate and atomize, resulting in atomic emissions. These emissions are captured by an embedded fiber optic system and recorded using a broadband optical spectrometer for element identification and quantification. Plasma emission spectroscopy offers several advantages including, for example: (i) it is simpler than laser-induced breakdown spectroscopy (LIBS) due to lack of laser beam shaping optics and alignment; (ii) ability to obtain high energy per pulse relative to a laser source of the same physical size, (iii) it has been shown that accuracy, precision, and limits of detection can be achieved, and (iv) it is readily amenable to miniaturization owing to the compact size of spark generation and spectroscopic hardware, thus making it ideal for onboard engine instrumentation.

Traditional spark emission spectroscopy may be used as an analytical source of excitation for elemental detection. In typical spark emission spectroscopy, an electric discharge between the electrodes leads to plasma formation and subsequent ablation of the particulate sample. Ablated material is vaporized, atomized and electronically excited in the plasma. Typical detection limits for the analysis of solids using spark emission spectroscopy range from a few ppm to a few 100 ppb; in terms of absolute mass. When applied to the analysis of airborne particles, spark spectroscopy works well, albeit at higher detection limits but still good enough to resolve down to the lowest concentration limit of the Rolls Royce envelope of possible operation (10-100's µg/m3).

Figure 17:
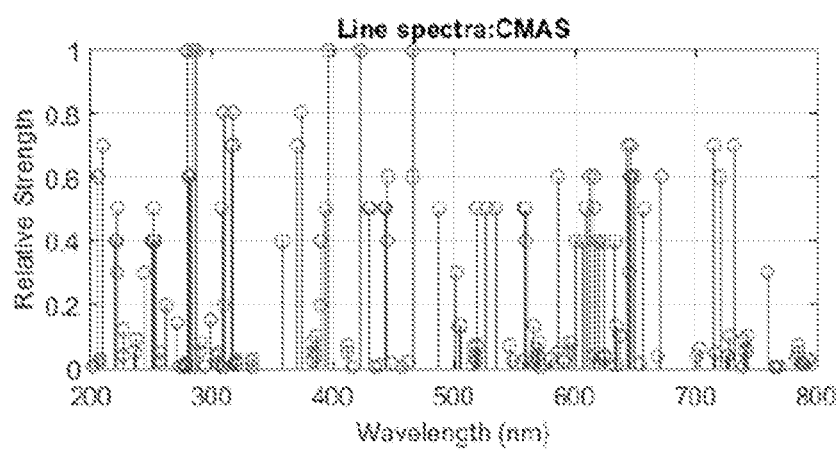
FIGS. 17A and 17B illustrate atomic spectra lines for CMAS.
Figure 17:
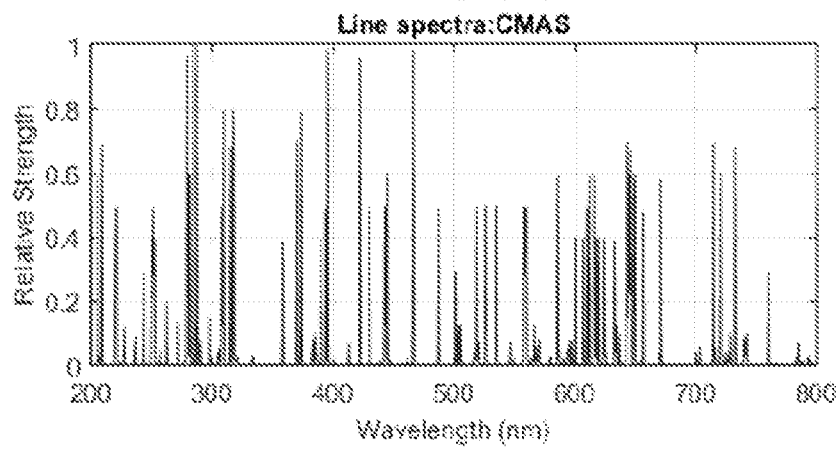

The elemental line spectra for the combined CMAS particle composition is shown in FIGS. 17A and 17B. The spectra are all normalized to the magnitude of the highest peak. The top chart in the figure shows all the lines and their relative strengths, while the bottom chart in the figure is a continuous representation resampled at the resolution of the spectrometer used in the bench top experiments as part of the proof-of-concept testing that was performed. It should be noted that the resampled spectra does not incorporate the spectrometer's response function.

The interaction of particles with plasma falls into the research field of dusty plasmas. Dusty plasmas are interesting because the presence of particles significantly alters the charged particle equilibrium leading to different properties. Among them is the plasma frequency, which is given by:

$$\omega_{pd} = (4\pi Z^2 e^2 n_d/m_d)^{1/2} \text{ (rad/sec)} \tag{1}$$

$$\frac{\omega_{pd}}{\omega_{pe}} = Z\left(\frac{n_d}{m_d}\frac{m_e}{n_e}\right)^{1/2} \tag{2}$$

Figure 18:
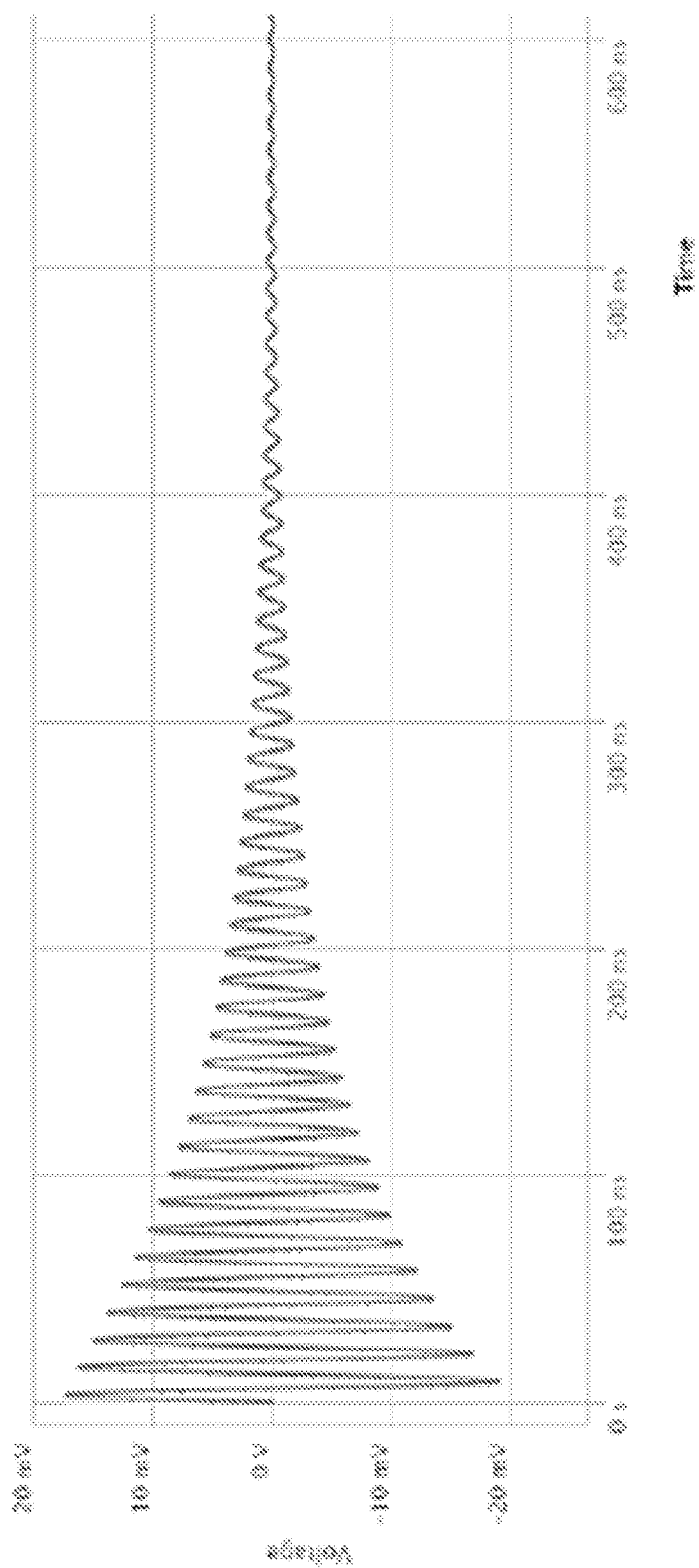
FIG. 18 is simulated sensing electrode circuit response to an external voltage pulse that represents particle interaction with the plasma field.

In the above equations, is the dust plasma frequency, $\omega_{pd}$ is the electron plasma frequency, Z is the dust grain charge in electron charge units and ne, me and nd, and are the electron and grain number density and mass, respectively. If we consider a set of nominal parameters, such as, Z=ne~$10^3$-$10^5$e
e=1.6022×$10^{-19}$ C
$n_e$~1×$10^8$-1×$10^{11}$ cm$^{-3}$
$n_d$~$10^3$-$10^7$ cm$^{-3}$
$m_e$~9.1094×$10^{-28}$ g
$m_d$~3×$10^{-7}$-3×$10^{-13}$ g then, $\omega_{pd}$ is of the order of 100 kHz, while $\omega_{pe}$ is of the order of 100 MHz. This implies that at these high frequencies the technique enables time resolution on the order of nanoseconds.

$$L\frac{di}{dt} + Ri(t) + \frac{1}{C}Q(t) = V(t) \tag{3}$$

where Q is the capacitor charge, i is the current in the circuit and Ri(t), L di dt, and 1 C Q(t) are the voltages across the equivalent probe elements R1, L1 and C1, respectively. Estimated values of R1, L1 and C1 were considered in the simulation. The capacitor value also included the estimated probe and distributed capacitance of the connecting wires. The response exhibits a high frequency oscillation that decays exponentially, given by the following equation:

$$V(t) = V_0(e^{-t/\tau}) \tag{4}$$

where $\tau$=R2C2. Time scales are in the order of nanoseconds, with the envelope of the oscillatory burst related to the energy stored in the capacitor and the initial voltage level. Experimentally obtained electrical signals from particle interactions with the plasma field are shown in FIG. 18. The shape of the experimental particle bursts supports the simulated circuit model. As can be seen from the experimental data, the envelope of the burst and the initial voltage level are related to the size of the particle making contact with the plasma field.

In various embodiments, a small closed loop flow tunnel may be used to support development testing activities within a particle laden environment. In various embodiments, the tunnel may be made using a combination of typical PVC piping and 3D printed plastic sections that could be taken apart for cleaning purposes. In various embodiments, the test section where the probe is inserted includes glass windows on the two opposite sides for visualization purposes, and a top mount for a lens that enabled spectroscopy using free-space optics mounted on a rail system.

Both static and dynamic flow conditions can be investigated, with the flow stream within the tunnel generated using two small fans that circulate the enclosed air. The test section featured a 1-cm round jet flow configuration in which the probe can be inserted for testing under dynamic conditions. Flow stream velocities of nearly 70 m/s (150 mph) were generated using this configuration. Additional fans could be added to increase the speed in the future if desired. The fans have a low cost and thus can be easily replaced to accommodate testing of multiple particle types and/or when they stop performing as expected.

In various embodiments, introduction of the probe within the test section may be from the bottom, while a set of free space optics on the top enabled spectroscopic measurements to be performed to serve as a baseline for similar measurements performed via integrated optics within the probe body. In various embodiments, the light collected was transmitted via fiber optics to a spectrometer. In addition, a high resolution imager (viewing area of about 1.9 mm by 1.5 mm with resolution of 1 micron per pixel) was installed to visualize particle interactions with the probe, aided by laser illumination. FIG. 6 also shows a photograph of an active probe subjected to a cross-flow at maximum flow velocity. The surface generated plasma field is stretched by the flow field, which is an important consideration in regards to the placement of embedded sensory elements.

The baseline approach is to have the probe flush with the wetted surface, thus to not intrude into the flow field. As such, the probe tip, and thus the plasma discharge field, will be influenced by the shear velocity adjacent to the wall.

Spectral measurement over the range of 200 nm to 1000 nm were performed using a commercial small format spectrometer. Within this broad range are background air emission spectra that need to be managed as part of the spectral calculations to determine the species composition of the particles. A review of the open literature showed that many of the strong spectra found in the experimental data within the range of 300 nm to 400 nm are due to contributions from partially dissociated species (NO, OH), electronically dissociated species (N2+, O2−) and molecular species (O2, N2).

In various embodiments, bare fiber optics embedded within the probe tip may be used to detect the optical emission of the plasma discharge. The placement of the fiber results in some selectivity over the spectra that are measured (cathodic versus anodic species), hence this aspect needs to be considered as part of the probe tip design. All spectra show the oxygen line, albeit it is strongest measured with the fiber in the middle (one order of magnitude greater intensity than the signal measured with the other 2 fibers).

Additional testing in quiescent conditions using a clean test chamber and AFRL-03 sand was done with the probe operating in a free-running mode and asynchronously with the spectrometer. A long integration time of 2 ms was set for the spectrometer so that it would capture most often the discharge from the probe. AFRL-03 particles were introduced in the test chamber after the start of acquisition. This data was obtained using the free-space optics.

Atomic spectra of MgO particles were obtained under dynamic flow conditions. The spectral content of particles in the flow stream was characterized mainly by the strong neutral atomic band of Magnesium (Mg I) at about 517 nm (516.7322, 517.2684 and 518.3604 nm) and the singly ionized state (Mg II) at 279.55301 nm. Plasma luminosity was simultaneously measured, and the signal from the downstream optical fiber is also shown in the figure. Air background spectra are also measured and intensity variations at those wavelengths correspond to plasma discharge illumination changes as a result of particle interactions.

The temporal agreement between the free-space spectral measurement and the embedded fiber luminosity measurement corresponding to high intensity peaks confirms that the embedded fiber strategy will perform as anticipated to not only yield spectral information, but also additional information regarding size and number count of particles. The latter point is supported by the multiple intensity peaks that are observed during a single plasma discharge event, which are in-differentiable due to the long interrogation time of the spectrometer. The electrostatic signature of the plasma field will also show a similar signature for multiple particle interactions.

In various embodiments, by continuously time averaging the spectra, particle identification may be improved as the atomic lines for Mg I and Mg II become increasingly distinct. Such methods of continuously averaging results at the first level of processing, in this case spectrometer output, successfully improve subsequent steps of analysis if the raw signal being acquired has similar characteristics over time. This is valid in the particle ingestion problem since for a specific sand or volcanic ash event the composition properties of the cloud of particles will be statistically the same. Random noise will statistically yield broadband noise as the ensemble accumulation and averaging process is implemented, thus yielding a more distinct signal for species identification at the next analytical step.

Figure 19:
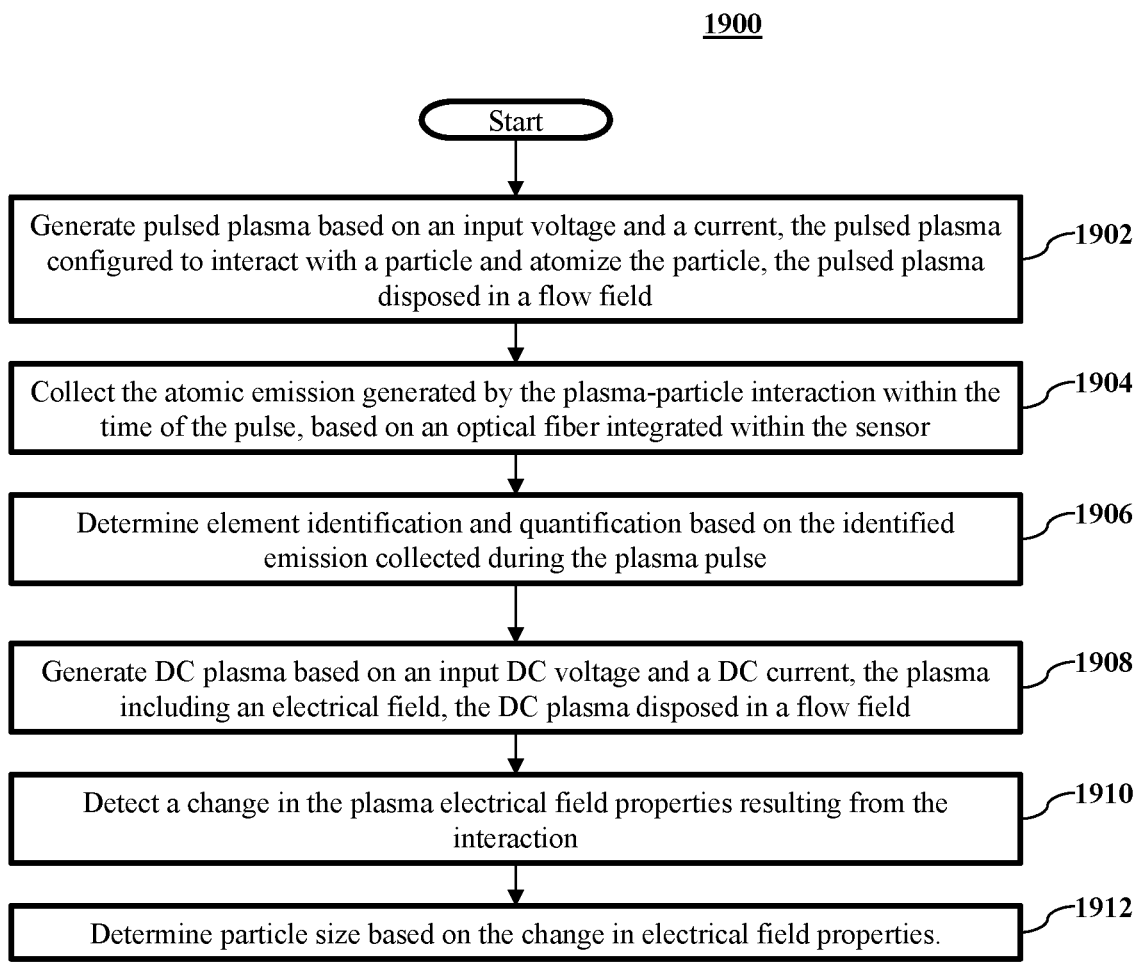
FIG. 19 is a block diagram of a method for element identification and quantification.
Figure 22:
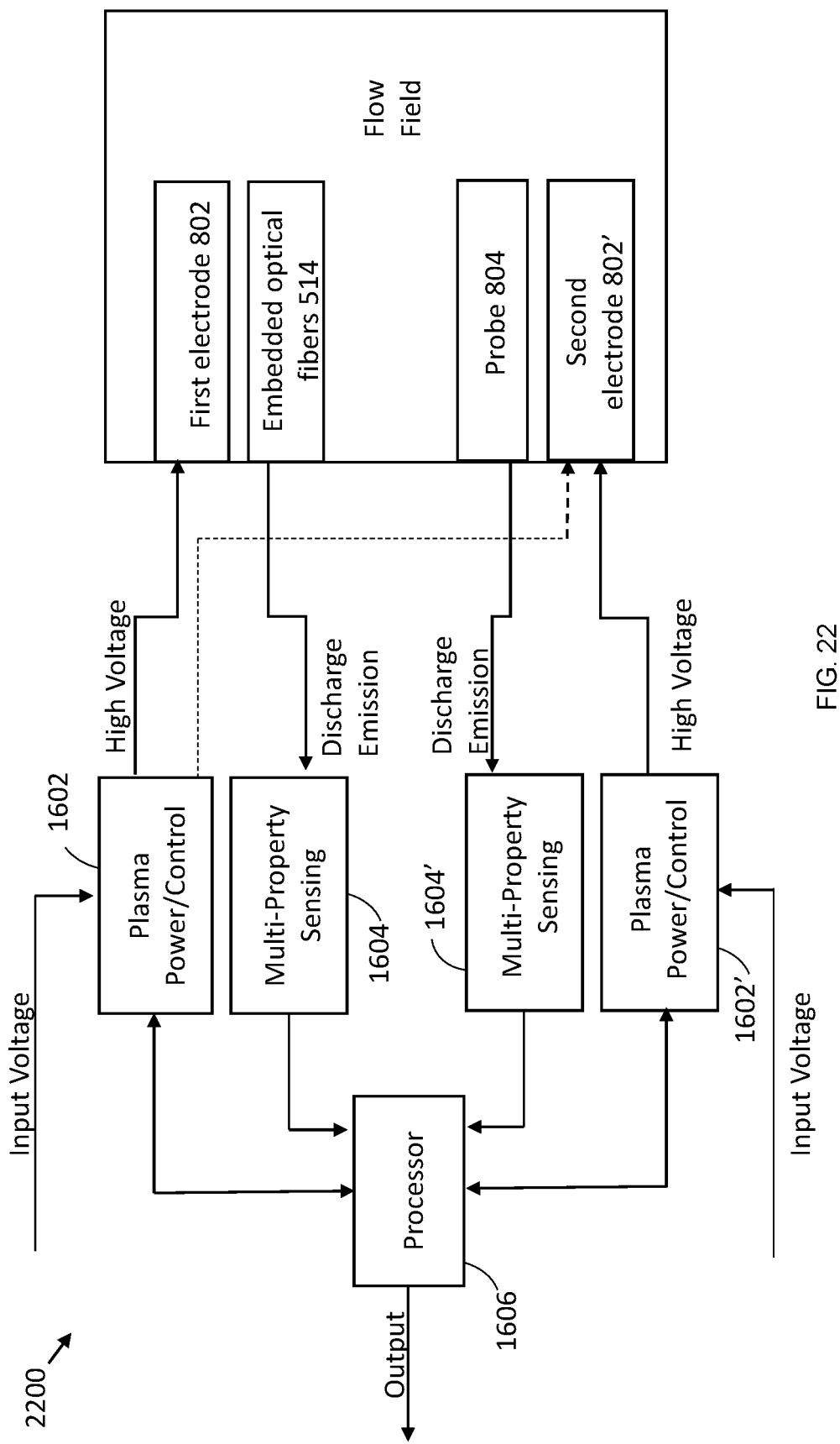
FIG. 22 is a block diagram of a plasma-based system for detecting atomic emissions.

With reference to FIGS. 19 and 22, exemplary block diagrams of a method for element identification and quantification in accordance with aspects of this disclosure are shown. The following description will refer to the system, but it will be understood that such description is exemplary and does not limit the scope and applicability of this disclosure.

Initially at step 1902, the system 2200 generates pulsed plasma based on an input voltage and a current. The plasma power and control unit 1602 receives a low voltage (e.g., 5V DC), for example from a vehicle, such as a jet. The plasma power and control unit 1602 then generates a high voltage (e.g., 5 kV) and delivers this high voltage to the probe 510. The probe includes embedded fibers 514 (e.g., optical probe) disposed on either side of an electrode configured to generate the pulsed plasma. (See FIG. 5) The pulsed plasma is disposed in a particle laden flow field. The pulsed plasma is configured to interact with a particle and atomize the particle. In various embodiments, the system may include a power control unit configured to supply the input voltage and the current to the first electrode. In various embodiments, the pulsed plasma is generated based on an input voltage and a current. In various embodiments, the plasma includes an electrical field. In various embodiments, the optical probe includes an optical fiber.

Next at step 1904, the system 2200 identifies an atomic emission of the pulsed plasma based on an optical sensor. In various embodiments, the optical sensor may be disposed proximate to the plasma emission. When a particle interacts with the plasma, the particle ablates and atomizes (dissociates) resulting in atomic emissions. This atomic emission is recorded by the optical probe and communicated to the sensing unit 1604. In various embodiments, the sensing unit 1604 includes an optical spectrometer. The sensing unit 1604 sends the sensed properties of the atomic emissions to the processing unit 1606 for further processing. In various embodiments, sensing unit 1604 includes other methods that allow identification of the atomic emission wavelengths in the spectral emission received through the optical probe.

Next at step 1906, the system 2200 determines the identification and quantification of the elements based on the identified emission of the pulsed plasma.

Next at step 1908, the system 2200 generates DC plasma based on an input DC voltage and a DC current, the plasma including an electrical field, the DC plasma disposed in a flow field. In various embodiments, the DC plasma may be generated by the same electrode that generates the pulsed plasma.

Next at step 1910, the system 2200 includes a second probe, which may be configured to detect changes to the electrical field resulting from the interaction. In various embodiments, the second probe includes a Langmuir probe. In various embodiments, the probe includes a second electrode. In various embodiments, the first electrode and the probe may be disposed in a ceramic filled mold. In various embodiments, a conductive porous cap may be disposed over the first electrode and the probe, the cap configured to confine the DC plasma.

Next at step 1912, the system 2200 determines the particle size based on the change in the electrical field properties.

The embodiments disclosed herein are examples of the disclosure and may be embodied in various forms. For instance, although certain embodiments herein are described as separate embodiments, each of the embodiments herein may be combined with one or more of the other embodiments herein. Specific structural and functional details disclosed herein are not to be interpreted as limiting, but as a basis for the claims and as a representative basis for teaching one skilled in the art to variously employ this disclosure in virtually any appropriately detailed structure.

The phrases "in an embodiment," "in embodiments," "in various embodiments," "in some embodiments," or "in other embodiments" may each refer to one or more of the same or different embodiments in accordance with this disclosure.

It should be understood that the description herein is only illustrative of this disclosure. Various alternatives and modifications can be devised by those skilled in the art without departing from the disclosure. Accordingly, this disclosure is intended to embrace all such alternatives, modifications and variances. The embodiments described are presented only to demonstrate certain examples of the disclosure. Other elements, steps, methods, and techniques that are insubstantially different from those described above and/or in the appended claims are also intended to be within the scope of the disclosure.

What is claimed is:

1. A plasma sensor, comprising:
a first electrode configured to generate pulsed plasma based on an input voltage and a current so that the pulsed plasma interacts with a particle and atomizes the particle when the pulsed plasma is disposed in a flow field;
embedded fiber optics disposed on either side of the first electrode configured for presence detection, atomic species element identification and quantification of the atomized particle;
a second electrode configured to generate DC plasma having an electrical field based on an input DC voltage and a DC current, the second electrode configured to dispose the DC plasma in a flow field;
a probe configured to detect a change in the electrical field; and
a power control unit configured to supply the input DC voltage and the DC current to the second electrode,
wherein the probe is in electrical communication with a processor configured to identify particle size based on the change in the electrical field.

2. The plasma sensor of claim 1, wherein the first electrode is further configured to generate DC plasma having an electrical field based on an input DC voltage and a DC current, the first electrode configured to dispose the DC plasma in the flow field.

3. The plasma sensor of claim 1, wherein the probe includes a Langmuir probe.

4. The plasma sensor of claim 1, wherein the second electrode and the probe are encapsulated in a cap, the cap configured to confine the DC plasma.

5. The plasma sensor of claim 4, wherein the cap includes ceramic.

6. The plasma sensor of claim 1, wherein, the plasma sensor further includes a conductive, porous cap disposed over the second electrode and the probe, the cap configured to confine the DC plasma.

7. A plasma-based sensing system, the plasma-based sensing system comprising:
a plasma sensor including:
a first electrode configured to generate pulsed plasma based on an input voltage and a current so that the pulsed plasma interacts with a particle and atomizes the particle when the pulsed plasma is disposed in a flow field; and
a second electrode configured to generate DC plasma having an electrical field based on an input DC voltage and a DC current, the second electrode configured to dispose the DC plasma in the flow field;
an optical probe configured for presence detection, atomic species element identification and quantification of the atomized particle;
a second probe configured to detect a change in the electrical field;
a first power control unit configured to supply the input voltage and the current to the first electrode;
a second power control unit configured to supply the input DC voltage and the DC current to the second electrode; and
a processor in electrical communication with the optical probe and configured to identify an atomic emission of the pulsed plasma,
wherein the processor is in electrical communication with the second probe and configured to identify particle size based on the change in the electrical field.

8. The plasma-based sensing system of claim 7, wherein the processor is further configured to determine particle composition based on the identified atomic emission.

9. The plasma-based sensing system of claim 7, wherein the first electrode is further configured to generate DC plasma having an electrical field based on an input DC voltage and a DC current, the first electrode configured to dispose the DC plasma in the flow field.

10. The plasma-based sensing system of claim 7, further including a user interface configured to enable user control of DC plasma properties.

11. The plasma-based sensing system of claim 7, further including a user interface configured to enable user control of pulsed plasma properties.

12. The plasma-based sensing system of claim 7, further including a display to display the identified particle size.

13. The plasma-based sensing system of claim 7, wherein the processor is further configured to determine a fluid dynamic based on the input DC voltage and the DC current.

14. The plasma-based sensing system of claim 7, wherein the processor is further configured to:
determine a plasma property including sheath potential ($\varphi pl(t)$), electron number density (ne), floating potential ($\varphi f(t)$), or combinations thereof; and
determine a change in a local pressure dynamic field based on the plasma property.

15. The plasma-based sensing system of claim 7, wherein the second probe includes a Langmuir probe.

16. A method for element identification and quantification, the method comprising:
generating, by a first electrode, pulsed plasma based on an input voltage and a current so that the pulsed plasma interacts with a particle and atomizes the particle when the pulsed plasma is disposed in a flow field;
identifying an atomic emission of the pulsed plasma with an optical sensor;
determining element identification and quantification based on the identified emission of the atomized particle;
generating, by a second electrode, DC plasma having an electrical field based on an input DC voltage and a DC current;
positioning the DC plasma in the flow field;
detecting a change in the electrical field of the DC plasma, by a probe;
determining a size of the particle based on the change in the electrical field; and
supplying the input DC voltage and the DC current to the second electrode, by a power control unit,
wherein the particle size is identified based on the change in the electrical field, by a processor in electrical communication with the probe.

17. The method of claim 16, further including determining particle composition based on the identified atomic emission.

18. The method of claim 16, further including determining a fluid dynamic based on the input DC voltage and the DC current.

19. The method of claim 16, further including displaying on a display at least one of the determined particle size or composition.

* * * * *

UNITED STATES PATENT AND TRADEMARK OFFICE
CERTIFICATE OF CORRECTION

| | | |
|---|---|---|
| PATENT NO. | : 11,469,082 B1 | Page 1 of 1 |
| APPLICATION NO. | : 16/436249 | |
| DATED | : October 11, 2022 | |
| INVENTOR(S) | : George Papadopoulos et al. | |

It is certified that error appears in the above-identified patent and that said Letters Patent is hereby corrected as shown below:

In the Specification

Column 1, Lines 18 through 21:
--This invention was made with U.S. government support under contract numbers DE-SC00I 8708, N68335-15-C-0282, and N68335-16-C-0500 awarded by SBIR/STTR. The U.S. government has certain rights in the invention.--

Should read:
--This invention was made with Government support under N68335-17-C-0249 awarded by the Department of the Navy. The Government has certain rights in this invention.--

Signed and Sealed this
Thirteenth Day of December, 2022

*Katherine Kelly Vidal*

Katherine Kelly Vidal
*Director of the United States Patent and Trademark Office*